(12) United States Patent
Kayaba et al.

(10) Patent No.: US 10,950,532 B2
(45) Date of Patent: Mar. 16, 2021

(54) SUBSTRATE INTERMEDIARY BODY, THROUGH-HOLE VIA ELECTRODE SUBSTRATE, AND THROUGH-HOLE VIA ELECTRODE FORMATION METHOD

(71) Applicant: Mitsui Chemicals, Inc., Tokyo (JP)

(72) Inventors: Yasuhisa Kayaba, Sodegaura (JP); Shoko Ono, Ichihara (JP); Hirofumi Tanaka, Sodegaura (JP); Koji Inoue, Ichihara (JP); Hiroko Wachi, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 275 days.

(21) Appl. No.: 15/535,761

(22) PCT Filed: Dec. 14, 2015

(86) PCT No.: PCT/JP2015/084973
§ 371 (c)(1),
(2) Date: Jun. 14, 2017

(87) PCT Pub. No.: WO2016/098738
PCT Pub. Date: Jun. 23, 2016

(65) Prior Publication Data
US 2017/0372993 A1   Dec. 28, 2017

(30) Foreign Application Priority Data

Dec. 17, 2014   (JP) .............................. JP2014-255013

(51) Int. Cl.
*H01L 23/498*   (2006.01)
*H01L 23/14*   (2006.01)
(Continued)

(52) U.S. Cl.
CPC .. *H01L 23/49827* (2013.01); *H01L 21/02164* (2013.01); *H01L 21/02203* (2013.01);
(Continued)

(58) Field of Classification Search
CPC ............. H01L 23/49827; H01L 23/145; H01L 21/486; H01L 21/76898; H01L 21/02216;
(Continued)

(56) References Cited

U.S. PATENT DOCUMENTS 3,909,469 A * 9/1975 Miller .................... C09J 179/02
  524/44
4,521,586 A * 6/1985 Fujita .................. C08G 63/668
  528/297

(Continued)

FOREIGN PATENT DOCUMENTS

| JP | 2007-305960 A | 11/2007 |
| JP | 2012-216722 A | 11/2012 |

(Continued)

OTHER PUBLICATIONS

International Search Report (PCT/ISA/210) dated Mar. 15, 2016, by the Japanese Patent Office as the International Searching Authority for International Application No. PCT/JP2015/084973.

(Continued)

*Primary Examiner* — Benjamin Tzu-Hung Liu
(74) *Attorney, Agent, or Firm* — Buchanan, Ingersoll & Rooney PC

(57) ABSTRACT

A substrate intermediary body includes: a substrate having a hole in a thickness direction, and a conductor being disposed in the hole; and an adhesion layer formed on a wall surface of the hole. The adhesion layer contains a reaction product of a polymer (A) having a cationic functional group and having a weight-average molecular weight of from 2,000 to 1,000,000 and a polyvalent carboxylic acid compound (B)

(Continued)

having two or more carboxyl groups per molecule or a derivative thereof.

11 Claims, 3 Drawing Sheets

(51) Int. Cl.
*H01L 21/48* (2006.01)
*H01L 21/768* (2006.01)
*H01L 21/02* (2006.01)
*H01L 23/48* (2006.01)
*H01L 23/532* (2006.01)

(52) U.S. Cl.
CPC .. *H01L 21/02216* (2013.01); *H01L 21/02282* (2013.01); *H01L 21/02362* (2013.01); *H01L 21/486* (2013.01); *H01L 21/76898* (2013.01); *H01L 23/145* (2013.01); *H01L 23/481* (2013.01); *H01L 23/53295* (2013.01); *H01L 2924/0002* (2013.01)

(58) Field of Classification Search
CPC ............. H01L 21/02362; H01L 23/481; H01L 21/02203; H01L 21/02282; H01L 21/02164; H01L 23/53295; H01L 2924/0002; H01L 21/3205; H01L 21/768; H01L 23/14; H01L 23/522; H01L 23/532; C01B 33/12
See application file for complete search history.

(56) References Cited

U.S. PATENT DOCUMENTS

| | | | | |
|---|---|---|---|---|
| 7,067,353 | B2 * | 6/2006 | Koizumi | H01L 21/568 257/734 |
| 9,780,008 | B2 | 10/2017 | Ono et al. | |
| 2005/0043184 | A1 * | 2/2005 | McCleskey | C23C 18/04 505/100 |
| 2008/0264900 | A1 * | 10/2008 | Feng | C09J 5/02 216/20 |
| 2011/0241210 | A1 | 10/2011 | Ono et al. | |
| 2013/0171826 | A1 * | 7/2013 | Ono | H01L 21/02334 438/694 |
| 2014/0102910 | A1 | 4/2014 | Rohde et al. | |
| 2015/0077685 | A1 * | 3/2015 | Okada | C09D 11/322 349/106 |
| 2015/0083469 | A1 * | 3/2015 | Sunohara | H01L 23/481 174/255 |
| 2015/0187670 | A1 | 7/2015 | Ono et al. | |
| 2016/0057866 | A1 * | 2/2016 | Shimoda | H01L 23/481 174/257 |
| 2016/0251548 | A1 * | 9/2016 | McArdle | C09J 4/00 156/94 |

FOREIGN PATENT DOCUMENTS

| | | | |
|---|---|---|---|
| JP | 2012216722 | * | 11/2012 |
| JP | 2014-22743 | A | 2/2014 |
| JP | 2014-523485 | A | 9/2014 |
| TW | 201407684 | A | 2/2014 |
| WO | WO 2010/137711 | A1 | 12/2010 |
| WO | WO 2012/033172 | A1 | 3/2012 |
| WO | WO 2014/013956 | A1 | 1/2014 |
| WO | WO 2014/156616 | A1 | 10/2014 |

OTHER PUBLICATIONS

Written Opinion (PCT/ISA/237) dated Mar. 15, 2016, by the Japanese Patent Office as the International Searching Authority for International Application No. PCT/JP2015/084973.

Examination Report issued by the Taiwanese Patent Office in corresponding Taiwanese Patent Application No. 104142193 dated Mar. 29, 2019 (7 pages including partial English translation).

* cited by examiner

SUBSTRATE INTERMEDIARY BODY, THROUGH-HOLE VIA ELECTRODE SUBSTRATE, AND THROUGH-HOLE VIA ELECTRODE FORMATION METHOD

TECHNICAL FIELD

The present invention relates to a substrate intermediary body, a through-hole via electrode substrate, and a through-hole via electrode formation method.

BACKGROUND ART

Conventionally, in various technical fields such as the field of electronic devices, application of a composition containing a polymer to a member has been conducted.

For example, there is known a technique of applying a semiconductor composition which contains a polymer having two or more cationic functional groups and having a weight-average molecular weight of from 2,000 to 100,000, to an interlayer insulating layer of a semiconductor device (see, for example, Patent Literature 1).

For example, there is known a technique of applying, to at least a part of a surface of a semiconductor substrate, a semiconductor sealing composition which contains a resin having a cationic functional group and having a weight-average molecular weight of from 2,000 to 600,000, thereby forming a semiconductor sealing layer, wherein the surface of the semiconductor substrate on which the semiconductor sealing layer has been formed is rinsed with a rinse having a pH at 25° C. of 6 or lower (see, for example, Patent Literature 2).

Furthermore, for example, there is known a technique of applying a sealing composition for a semiconductor to a semiconductor substrate, to form a sealing layer for a semiconductor on at least a bottom face and a side face of a recess part of the semiconductor substrate, the sealing composition containing a polymer having a cationic functional group and having a weight-average molecular weight of from 2,000 to 1,000,000, and subjecting a surface of the semiconductor substrate at a side at which the sealing layer has been formed to a heat treatment of from 200° C. to 425° C., to remove at least a part of the sealing layer for a semiconductor which has been formed on an exposed surface of wiring (see, for example, Patent Literature 3).

Furthermore, for example, there are known a substrate intermediary body having a hole filled with a through-hole via electrode material as a through-hole via electrode, and including a self-organization monomolecular film formed on the inner periphery of the hole and metal nanoparticles as an electroless plating catalyst adsorbed to the self-organization monomolecular film, and a technique of coating metal nanoparticles with a protective agent selected from polyvinyl pyrrolidone, polyacrylic acid, polyethyleneimine, tetramethylammonium, and citric acid (see, for example, Patent Literature 4).

Furthermore, for example, there are known an integrated circuit element including a first through electrode part constituting one end of a TSV structure and including impurities of a first concentration, and a second through electrode unit constituting the other end of the TSV structure and including impurities of a second concentration greater than the first concentration, and a technique of forming a conductive film on a substrate in an electroplating step using a plating composition containing a leveling agent containing amine or an aromatic acting group in a stage of forming the TSV structure (see, for example, Patent Literature 5).

For example, there is known a technique of a semiconductor device including a semiconductor substrate having a through hole penetrating both surfaces, an electrode pad provided so as to cover the through hole, an external connection terminal, a conductive wiring passing through the through hole and conductively connecting the electrode pad and the external connection terminal to each other, a first insulating film for insulating the electrode pad and the semiconductor substrate from each other, and a second insulating film provided on the inner surface of the through hole in order to insulate the conductive wiring and the semiconductor substrate from each other, wherein a film made of polyimide, an epoxy resin, an acrylic resin, or a silicone resin is used for the second insulating film (see, for example, Patent Literature 6).

CITATION LIST

Patent Literature

Patent Literature 1: International Publication No. 2010/137711

Patent Literature 2: International Publication No. 2012/033172

Patent Literature 3: International Publication No. 2014/013956

Patent Literature 4: Japanese Patent Application Laid-Open (JP-A) No. 2012-216722

Patent Literature 5: Japanese Patent Application Laid-Open (JP-A) No. 2014-22743

Patent Literature 6: Japanese Patent Application Laid-Open (JP-A) No. 2007-305960

SUMMARY OF INVENTION

Technical Problem

In a substrate such as a silicon substrate in which a through electrode is disposed as an electrode, it is necessary to improve the adhesion between the wall surface of a hole of the substrate and an electrode being disposed in the hole, thereby suppressing the peeling of a conductor as the electrode from the substrate. In order to suppress an increase in power consumption and deterioration in an element caused by generation of heat, it is necessary to suppress leakage current and to electrically insulate the substrate and the electrode from each other.

It is an object of one embodiment of the present invention to provide a substrate intermediary body, a through-hole via electrode substrate, and a through-hole via electrode formation method which can improve adhesion between a wall surface of a hole of a substrate and a conductor being disposed in the hole, thereby suppressing the peeling of the conductor, and leakage current.

Solution to Problem

Specific means for addressing the above problems are as follows.

<1> A substrate intermediary body includes: a substrate having a hole in a thickness direction, and a conductor being disposed in the hole; and an adhesion layer formed on a wall surface of the hole. The adhesion layer contains a reaction product of a polymer (A) having a cationic functional group and having a weight-average molecular weight of from 2,000 to 1,000,000 and a polyvalent carboxylic acid compound (B) having two or more carboxyl groups per molecule or a derivative thereof.

<2> The substrate intermediary body according to <1>, further including an insulating layer provided between the substrate and the adhesion layer.

<3> The substrate intermediary body according to <1> or <2>, wherein the polymer (A) is a cationic functional group equivalent weight of from 27 to 430.

<4> The substrate intermediary body according to any one of <1> and <3>, wherein the polymer (A) is polyethyleneimine or a polyethyleneimine derivative.

<5> The substrate intermediary body according to any one of <1> to <4>, wherein the polyvalent carboxylic acid compound (B) has an aromatic ring.

<6> The substrate intermediary body according to any one of <1> to <5>, wherein the reaction product has at least one of an amide bond or an imide bond.

<7> A through-hole via electrode substrate includes: the substrate intermediary body according to any one of <1> to <6>; and an electrode as the conductor disposed in the hole.

<8> The through-hole via electrode substrate according to <7>, further including a barrier layer provided between the adhesion layer and the electrode.

<9> A through-hole via electrode formation method includes: a first step of forming a film containing a polymer (A) having a cationic functional group and having a weight-average molecular weight of from 2,000 to 1,000,000 on a wall surface of a hole of a substrate, the hole being provided in a thickness direction of the substrate; a second step of applying a polyvalent carboxylic acid compound (B) having two or more carboxyl groups per molecule or a derivative thereof onto the film containing the polymer (A); a step of heating the film containing the polymer (A) and the polyvalent carboxylic acid compound (B) or the derivative thereof at from 200° C. to 425° C., thereby forming an adhesion layer after the second step; and a step of forming an electrode in the hole in which the adhesion layer is formed.

Advantageous Effects of Invention

One embodiment of the present invention can provide a substrate intermediary body, a through-hole via electrode substrate, and a through-hole via electrode formation method which improve adhesion between a wall surface of a hole of a substrate and a conductor being disposed in the hole, thereby suppressing the peeling of the conductor, and leakage current.

DESCRIPTION OF EMBODIMENTS

Figure 1:
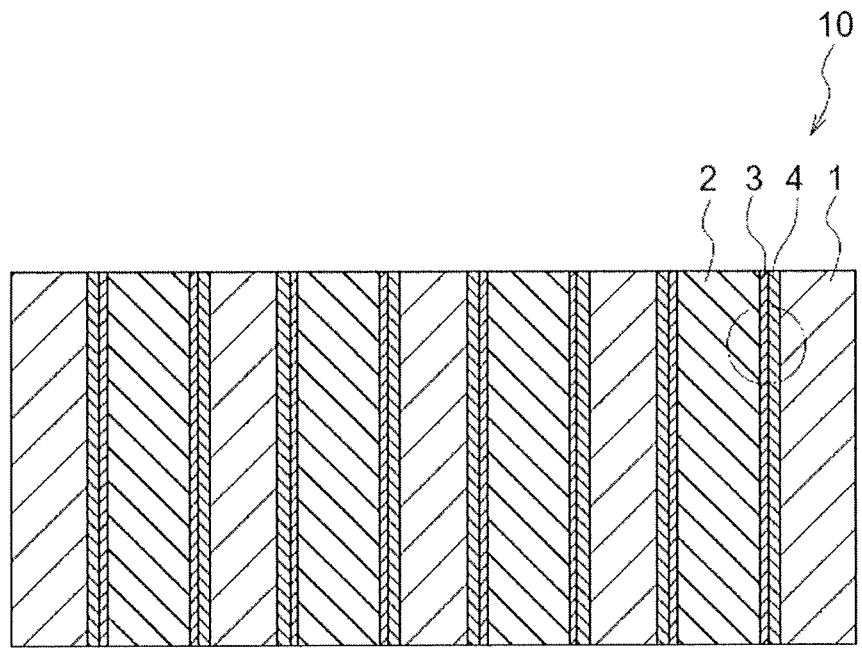
FIG. 1 is a conceptual sectional view schematically showing the cross section of a through-hole via electrode substrate according to the present disclosure.

In the present specification, a numeral value range represented by "(a value) to (a value)" means a range including the numeral values represented before and after "(a value) to (a value)" as a lower limit value and an upper limit value, respectively.

[Substrate Intermediary Body]

A substrate intermediary body of the present disclosure includes: a substrate having a hole in a thickness direction, and a conductor being disposed in the hole; and an adhesion layer formed on a wall surface of the hole, wherein the adhesion layer contains a reaction product of a polymer (A) having a cationic functional group and having a weight-average molecular weight of from 2,000 to 1,000,000 and a polyvalent carboxylic acid compound (B) having two or more carboxyl groups per molecule or a derivative thereof.

In the substrate intermediary body of the present disclosure, the adhesion layer contains the reaction product derived from the polymer (A), which can provide an improvement in the adhesion between the substrate and the conductor being disposed in the hole.

Furthermore, the adhesion layer contains the reaction product derived from the polyvalent carboxylic acid compound (B), which can suppress leakage current. In more detail, it is surmised that the leakage current can be suppressed from the following reasons, but the present invention is not limited from the following reasons.

Since the polymer (A) has the cationic functional group, leakage current due to proton conduction may occur. On the other hand, in the present disclosure, the polyvalent carboxylic acid compound (B) is applied, and the cationic functional group of the polymer (A) and a carboxyl group of the polyvalent carboxylic acid compound (B) react with each other, thereby forming a bond. This suppresses the proton conduction, thereby suppressing the leakage current.

The substrate intermediary body of the present disclosure may further include an insulating layer provided between the substrate and the adhesion layer.

[Polymer (A)]

In the substrate intermediary body of the present disclosure, the polymer (A) having a cationic functional group and having a weight-average molecular weight of from 2,000 to 1,000,000 is used. Specifically, the polymer (A) is used for the generation of the reaction product contained in the adhesion layer of the substrate intermediary body.

The "cationic functional group" in the present disclosure is not particularly limited as long as it is a functional group capable of being positively charged.

As the cationic functional group, a functional group containing a nitrogen atom (a primary nitrogen atom, a secondary nitrogen atom, a tertiary nitrogen atom, or a quaternary nitrogen atom) is preferable. Here, the "functional group containing a nitrogen atom" may also be a functional group constituted by only one nitrogen atom.

The polymer (A) of the present disclosure preferably contains two or more cationic functional groups containing at least one of a tertiary nitrogen atom or a quaternary nitrogen atom.

In the present disclosure, a polymer containing two or more cationic functional groups containing at least one of a tertiary nitrogen atom or a quaternary nitrogen atom means a polymer containing two or more cationic functional groups containing at least one of a tertiary nitrogen atom or a quaternary nitrogen atom as a cationic functional group (that is, a polymer containing two or more cationic functional groups in which at least one of the two or more cationic functional groups is at least one of a tertiary nitrogen atom or a quaternary nitrogen atom).

The polymer (A) of the present disclosure is preferably a polymer containing two or more of at least one of a tertiary nitrogen atom or a quaternary nitrogen atom (particularly preferably a tertiary nitrogen atom) as a cationic functional group.

The polymer (A) of the present disclosure may contain primary nitrogen atoms or secondary nitrogen atoms as a cationic functional group.

In a case in which the polymer (A) of the present disclosure contains primary nitrogen atoms, the proportion of the primary nitrogen atoms to all the nitrogen atoms in the polymer is preferably 33% by mole or more. If the polymer (A) of the present disclosure contains primary nitrogen atoms (particularly, if the percentage of primary nitrogen atoms is 33% by mole or more), the wettability between the polymer (A) and an insulating layer to be described below is further improved. Furthermore, in a case in which the insulating layer is made of porous silica, the uniformity of the thickness of the adhesion layer is further improved, and thus the sealing property can be further improved.

In a case in which the polymer (A) contains primary nitrogen atoms, it is preferable that nitrogen atoms other than primary nitrogen atoms, such as secondary nitrogen atoms, coexist with the primary nitrogen atoms. By virtue of this, the thickness of the adhesion layer is easily adjusted to an appropriate range, and the sealing property can be further improved.

The polymer (A) may further contain an anionic functional group or a nonionic functional group or the like if necessary.

The nonionic functional group may be a hydrogen bond receptor or a hydrogen bond donor. Examples of the nonionic functional group include a hydroxyl group, a carbonyl group, and an ether group (—O—).

The anionic functional group is not particularly limited as long as it is a functional group capable of being negatively charged. Examples of the anionic functional group include a carboxylic acid group, a sulfonic acid group, and a sulfuric acid group.

The polymer (A) preferably contains two or more cationic functional groups containing at least one of a tertiary nitrogen atom or a quaternary nitrogen atom per molecule. A polymer having a high cation density is preferable from the viewpoint of improving adhesion with an insulator or a conductor. Specifically, a cationic functional group equivalent weight is preferably from 27 to 430, and more preferably from 43 to 200.

Furthermore, in a case in which the surface of an insulating layer is hydrophobic treated by a known method, for example, a method described in WO 04/026765 pamphlet or WO 06/025501 pamphlet or the like, the cationic functional group equivalent weight is also preferably from 43 to 200 since the polar group density on the surface decreases.

The cationic functional group equivalent weight herein means a weight-average molecular weight per cationic functional group, and is a value (Mw/n) obtained by dividing the weight-average molecular weight (Mw) of a polymer by the number (n) of a cationic functional group contained in the polymer corresponding to one molecule. The density of cationic functional group is low as this cationic functional group equivalent weight is large, and the density of cationic functional group is high as this cationic functional group equivalent weight is small.

The weight-average molecular weight of the polymer (A) is from 2,000 to 1,000,000, preferably from 2,000 to 600,000, preferably from 10,000 to 200,000, more preferably from 20,000 to 200,000, and still more preferably from 20,000 to 150,000.

For example, if the weight-average molecular weight of the polymer (A) is less than 2,000, the size of the polymer (A) is smaller than the pore diameter on the insulating layer, and thus the polymer molecule enters into the pore on the insulating layer, and as a result, the dielectric constant of the insulating layer increases in some cases. In addition, if the weight-average molecular weight of the polymer (A) is less than 2,000, the polymer (A) does not multipoint adsorb in some cases.

The weight-average molecular weight is measured using a GPC device used commonly in the molecular weight measurement of polymer.

The polymer (A) used in the present disclosure further contains, preferably at least one polymer having a branching degree of 48% or more, and more preferably at least one polymer containing two or more cationic functional groups containing at least one of a tertiary nitrogen atom or a quaternary nitrogen atom, and having a branching degree of 48% or more.

The branching degree of the polymer is 48% or more, and the insulating layer can be suitably protected by the adhesion layer containing the polymer. For example, the diffusion of a metal component or a plasma component into an insulating layer can be more effectively suppressed. As this reason why the effect is obtained, it is presumed that the molecular chains of the polymer having a branch structure are entangled with one another and thus the aperture between the molecular chains becomes small, which can efficiently prevent a metal component or a plasma component or the like from passing through between the molecular chains.

The effect is more effectively exhibited in a case in which the insulating layer contains a porous material such as porous silica.

In the present disclosure, the term "branching degree" denotes a value obtained by the following Formula 1.

Branching degree (%)=((number of tertiary nitrogen atom+number of quaternary nitrogen atom)/ (number of secondary nitrogen atom+number of tertiary nitrogen atom+number of quaternary nitrogen atom))×100     Formula 1

Accordingly, for example, in a case in which the polymer of the present disclosure is polyalkyleneimine, linear polyalkyleneimine does not contain any tertiary nitrogen atom or quaternary nitrogen atom, and thus the linear polyalkyleneimine is polyalkyleneimine having a branching degree of 0%, and polyalkyleneimine in which all the nitrogen atoms contained in a backbone moiety except the terminals are tertiary nitrogen atoms (that is, it is maximally branched) is polyalkyleneimine having a branching degree of 100%.

In the present disclosure, the term "primary nitrogen atom" denotes a nitrogen atom bonded only to two hydrogen atoms and one atom other than a hydrogen atom (for example, the nitrogen atom contained in a primary amino group (—$NH_2$ group)), or a nitrogen atom (cation) bonded only to three hydrogen atoms and one atom other than a hydrogen atom.

The term "secondary nitrogen atom" denotes a nitrogen atom bonded only to one hydrogen atom and two atoms other than a hydrogen atom (for example, the nitrogen atom contained in the functional group represented by the following Formula (a)), or a nitrogen atom (cation) bonded only to two hydrogen atoms and two atoms other than a hydrogen atom.

The term "tertiary nitrogen atom" denotes a nitrogen atom bonded only to three atoms other than a hydrogen atom (that is, the nitrogen atom of the functional group represented by the following Formula (b)), or a nitrogen atom (cation) bonded only to one hydrogen atom and three atoms other than a hydrogen atom.

The term "quaternary nitrogen atom" denotes a nitrogen atom (cation) bonded only to four atoms other than a hydrogen atom.

In the description above, the "atom other than a hydrogen atom" is not particularly limited, but examples thereof include a carbon atom and a silicon atom, and a carbon atom is preferable.

In Formulae (a) and (b), * represents a bonding position with an atom other than a hydrogen atom.

Here, the functional group represented by Formula (a) may be a functional group constituting a part of a secondary amino group (—NHR$^a$ group; here, R$^a$ represents an alkyl group), or a divalent linking group contained in the backbone of a polymer (A).

The functional group (that is, a tertiary nitrogen atom) represented by Formula (b) may be a functional group constituting a part of a tertiary amino group (—NR$^b$R$^c$ group; here, R$^b$ and R$^c$ each independently represent an alkyl group), or a trivalent linking group contained in the backbone of a polymer (A).

The branching degree of the polymer (A) is preferably 48% or more. Particularly, in a case in which the insulating layer is made of porous silica, from the viewpoint of further improving the sealing property, the branching degree is more preferably 55% or more, still more preferably 70% or more, and particularly preferably 75% or more.

The upper limit of the branching degree of the polymer (A) is not particularly limited, and the branching degree is less than 100% in a case in which the polymer (A) contains a secondary nitrogen atom. The branching degree of the polymer (A) is preferably 95% or less from the viewpoint of easiness of synthesis.

The method of adjusting the branching degree of the polymer (A) to 48% or more is not particularly limited. Examples thereof include a method in which the branching degree is adjusted by the polymerization condition of a monomer itself when a polymer (A) is synthesized, and a method in which a primary nitrogen atom or a secondary nitrogen atom contained in a polymer (A) is reacted with another nitrogen-containing compound or an alkyl compound, and thus a tertiary nitrogen atom or a quaternary nitrogen atom is generated from the primary nitrogen atom or the secondary nitrogen atom, thereby increasing the branching degree. A specific example of the latter method will be described as a "method of producing a polymer (A)" below.

The polymer (A) used in the present disclosure preferably contains a structural unit containing a cationic functional group (a structural unit derived from a monomer containing a cationic functional group). In this case, the structure of the polymer (A) may be a structure formed by the polymerization of a monomer containing a cationic functional group in a linear shape, or a structure formed by the polymerization of a monomer containing a cationic functional group in a branched shape.

In a case in which the polymer (A) used in the present disclosure contains a structural unit (hereinafter, it is referred to as a "specific structural unit" in some cases) containing a cationic functional group, the cationic functional group may be contained as at least a part of the main chain, as at least a part of a side chain, or as at least a part of the main chain and at least a part of a side chain in the specific structural unit.

Furthermore, in a case in which the specific structural unit contains two or more cationic functional groups, the two or more cationic functional groups may be the same as or different from each other.

The cationic functional group is contained such that the ratio (hereinafter, it is referred to as a "relative distance between cationic functional groups" in some cases) of the main chain length of the specific structural unit with respect to the average distance between the adsorption points (for example, a silanol residue) of the cationic functional groups present on the insulating layer is preferably 1.6 or less and more preferably from 0.08 to 1.0. By virtue of this aspect, the polymer is more efficiently multipoint adsorbed on the insulating layer.

The molecular weight of the specific structural unit is preferably from 30 to 500, and more preferably from 40 to 200 from the viewpoint of adsorptivity to the insulating layer. The molecular weight of the specific structural unit means the molecular weight of a monomer constituting the specific structural unit.

The specific structural unit preferably has a relative distance between the cationic functional groups of 1.6 or less and a molecular weight of from 30 to 500, and more preferably has a relative distance between the cationic functional groups of from 0.08 to 1.0 and a molecular weight of from 40 to 200 from the viewpoint of adsorptivity to an insulating layer.

Specific examples of the specific structural unit (a structural unit containing a cationic functional group) include the unit structure derived from a monomer containing a cationic functional group exemplified below.

Specific examples of the monomer containing a cationic functional group include an alkyleneimine, allylamine, diallyldimethylammonium salt, vinylpyridine, lysine, methyl vinylpyridine, and p-vinylpyridine.

The alkyleneimine is preferably an alkyleneimine having from 2 to 12 carbon atoms and more preferably an alkyleneimine having from 2 to 8 carbon atoms.

The alkyleneimine having from 2 to 12 carbon atoms is preferably a substituted or unsubstituted cyclic amine having from 2 to 8 carbon atoms.

Specific examples of the alkyleneimine having from 2 to 12 carbon atoms include ethyleneimine (another name: aziridine), propyleneimine (another name: 2-methyl aziridine), butyleneimine, pentyleneimine, hexyleneimine, heptyleneimine, octyleneimine, trimethyleneimine (another name: azetidine), tetramethyleneimine (another name: pyrrolidine), pentamethyleneimine (another name: piperidine), hexamethyleneimine, and octamethyleneimine. Among them, ethyleneimine is particularly preferable.

The monomer containing a cationic functional group is, among them described above, preferably at least one of an alkyleneimine (preferably an alkyleneimine having from 2 to 8 carbon atoms) or an allylamine, and more preferably an alkyleneimine (preferably an alkyleneimine having from 2 to 4 carbon atoms, and particularly preferably ethyleneimine) from the viewpoint of adsorptivity to an insulating layer and from the viewpoint of sealing property in a case in which the insulating layer is made of porous silica.

The polymer (A) used in the present disclosure preferably contains a structural unit which is derived from an alkyleneimine having from 2 to 8 carbon atoms (more preferably having from 2 to 4 carbon atoms) and which contains a tertiary nitrogen atom, as the specific structural unit (the structural unit containing a cationic functional group), from the viewpoint of adsorptivity to an insulating layer and from the viewpoint of sealing property in a case in which the insulating layer is made of porous silica.

The polymer (A) used in the present disclosure more preferably contains a structural unit which is derived from an alkyleneimine having from 2 to 8 carbon atoms (more preferably having from 2 to 4 carbon atoms) and which contains a secondary nitrogen atom, in addition to the "structural unit which is derived from an alkyleneimine having from 2 to 8 carbon atoms (more preferably having from 2 to 4 carbon atoms) and which contains a tertiary nitrogen atom", from the viewpoint of easiness of synthesis.

In a case in which a cationic functional group is introduced into the polymer by reacting at least one of a primary nitrogen atom or a secondary nitrogen atom contained in the polymer with a nitrogen-containing compound in order to increase the branching degree of the polymer (A), examples of a cationic functional group introduced into the polymer include a cationic functional group ("*" represents a bonding position with a nitrogen atom in the polymer backbone) represented below, or an aminopropyl group, a diaminopropyl group, an aminobutyl group, a diaminobutyl group, and a triaminobutyl group.

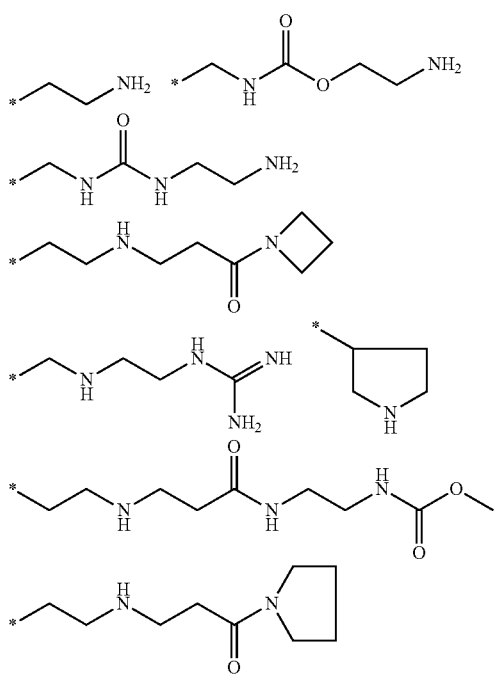

Among the cationic functional groups introduced into a polymer (A), an aminoethyl group is preferable from the viewpoints of decreasing a cationic functional group equivalent weight and increasing a cationic functional group density.

The polymer (A) may further contain at least one kind of a unit structure containing a nonionic functional group and a unit structure containing an anionic functional group.

Specific examples of the unit structure containing a nonionic functional group include a unit structure derived from a vinyl alcohol, a unit structure derived from an alkylene oxide, and a unit structure derived from vinylpyrrolidone.

Furthermore, specific examples of the unit structure containing an anionic functional group include a unit structure derived from styrenesulfonic acid, a unit structure derived from vinylsulfuric acid, a unit structure derived from acrylic acid, a unit structure derived from methacrylic acid, a unit structure derived from maleic acid, and a unit structure derived from fumaric acid.

In a case in which the polymer (A) contains two or more kinds of specific structural units in the present disclosure, the specific structural units may be different from each other in terms of any of the kind or the number of the contained cationic functional group, the molecular weight, or the like. The two or more kinds of specific structural units may be contained as a block copolymer or a random copolymer.

The polymer (A) may further contain at least one kind of structural unit (hereinafter, it is referred to as a "second structural unit" in some cases) other than the specific structural unit described above. In a case in which the polymer (A) contains a second structural unit, the polymer (A) may be a block copolymer containing the specific structural unit and the second structural unit or a random copolymer containing the specific structural unit and the second structural unit.

The second structural unit is not particularly limited as long as it is a structural unit derived from a monomer capable of being polymerized with a monomer constituting the specific structural unit. Examples thereof include a structural unit derived from an olefin.

In a case in which the polymer (A) used in the present disclosure is a polymer which does not contain a specific structural unit but contains a random structure formed by polymerizing a monomer constituting a polymer (A) in a branched manner, the cationic functional group may be contained as at least a part of the main chain, as at least a part of a side chain, or as at least a part of the main chain and at least a part of a side chain.

Specific examples of the polymer (A) used in the present disclosure include a polyalkyleneimine (for example, a polyalkyleneimine which is a polymer of an alkyleneimine having from 2 to 12 carbon atoms (preferably having from 2 to 8 carbon atoms, and more preferably having from 2 to 4 carbon atoms), and particularly preferably polyethyleneimine (PEI)), polyallylamine (PAA), polydiallyl dimethyl ammonium (PDDA), polyvinyl pyridine (PVP), poly-lysine, polymethyl pyridyl vinyl (PMPyV), protonated poly(p-pyridyl vinylene) (R-PHPyV), and any derivative thereof. Among them, a polyalkyleneimine (for example, a polyalkyleneimine which is a polymer of an alkyleneimine having from 2 to 12 carbon atoms (preferably having from 2 to 8 carbon atoms, and more preferably having from 2 to 4 carbon atoms), and particularly preferably polyethyleneimine (PEI)) or any derivative thereof, polyallylamine (PAA), or the like are preferable, and a polyalkyleneimine (for example, a polyalkyleneimine which is a polymer of an alkyleneimine having from 2 to 12 carbon atoms (preferably having from 2 to 8 carbon atoms, and more preferably having from 2 to 4 carbon atoms), and particularly preferably polyethyleneimine (PEI)) or any derivative thereof is more preferable.

Polyethyleneimine (PEI) can be generally produced by polymerizing ethyleneimine by a commonly used method. The polymerization catalyst and the polymerization conditions or the like can also be appropriately selected from those used commonly in the polymerization of ethyleneimine. Specifically, ethyleneimine can be subjected to a reaction, for example, at from 0 to 200° C. in the presence of an effective quantity of acid catalyst, for example, hydrochloric acid. Furthermore, ethyleneimine may be addition polymerized to base polyethyleneimine. Polyethyleneimine in the present disclosure may be a homopolymer of ethyleneimine or a copolymer of ethyleneimine and a compound copolymerizable with ethyleneimine, for example, an amine. The production method of such a polyethyleneimine may be referred to in, for example, Japanese Patent Publication (JP-B) No. S43-8828 and JP-B No. S49-33120 or the like.

Polyethyleneimine described above may be polyethyleneimine obtained using crude ethyleneimine obtained from monoethanolamine. Specific description thereon may be referred to in, for example, JP-A No. 2001-2123958 or the like.

A polyalkyleneimine other than polyethyleneimine can also be produced by the same method as that of polyethyleneimine.

Polyethyleneimine produced by the method described above contains a complicated backbone containing not only a partial structure in which ethyleneimine is ring opened and bonded in a linear shape, but also a partial structure in which ethyleneimine is ring opened and bonded in a branched shape, and a partial structure in which the partial structures in a linear shape are cross-linked with each other, or the like. A polyalkyleneimine other than polyethyleneimine also has a similar structure to that of polyethyleneimine.

A polymer (A) is more efficiently multipoint adsorbed by using a polymer containing a cationic functional group of the structure described above. Furthermore, a covering layer is more effectively formed by the interaction between polymers.

The polymer (A) used in the present disclosure is also preferably a derivative of polyalkyleneimine (for example, a derivative of polyalkyleneimine which is a polymer of an alkyleneimine having from 2 to 12 carbon atoms (preferably having from 2 to 8 carbon atoms, and more preferably having from 2 to 4 carbon atoms), and particularly preferably a derivative of polyethyleneimine). The derivative of polyalkyleneimine is not particularly limited as long as it is a compound which can be produced using the polyalkyleneimine described above. Specific examples thereof include a derivative of polyalkyleneimine in which an alkyl group (preferably an alkyl group having from 1 to 10 carbon atoms) or an aryl group is introduced into a polyalkyleneimine, and a derivative of polyalkyleneimine obtained by introducing a cross-linkable group such as a hydroxyl group into a polyalkyleneimine.

These derivatives of polyalkyleneimine can be produced by a method performed commonly using the polyalkyleneimine described above. Specifically, these derivatives of polyalkyleneimine can be produced based on the method described in, for example, JP-A No. H6-016809, or the like.

As a derivative of polyalkyleneimine, a highly branched type polyalkyleneimine obtained by increasing the branching degree of a polyalkyleneimine by reacting the polyalkyleneimine with a cationic functional group-containing monomer is also preferable.

Examples of the method of obtaining a highly branched type polyalkyleneimine include a method in which a polyalkyleneimine containing plural secondary nitrogen atoms in the backbone is reacted with a cationic functional group-containing monomer and thus at least a part of the plural secondary nitrogen atoms are substituted with the cationic functional group-containing monomer, and a method in which a polyalkyleneimine containing plural primary nitrogen atoms at terminals is reacted with a cationic functional group-containing monomer and thus at least a part of the plural primary nitrogen atoms are substituted with the cationic functional group-containing monomer.

Examples of the cationic functional group introduced in order to increase the branching degree include an aminoethyl group, an aminopropyl group, a diaminopropyl group, an aminobutyl group, a diaminobutyl group, and a triaminobutyl group, and an aminoethyl group is preferable from the viewpoint of decreasing the cationic functional group equivalent weight and increasing the cationic functional group density.

As the method of obtaining a highly branched type polyalkyleneimine, a method described in the section for a "method of producing a polymer (A)" to be described below can be used.

Polyethyleneimine described above and any derivative thereof may be a commercially available product. For example, polyethyleneimine and any derivative thereof sold by NIPPON SHOKUBAI CO., LTD., BASF Japan Ltd., or the like may also be appropriately selected and used.

The polymer (A) is also preferably a polymer, of which the critical micelle concentration in a water medium is 1% by weight or more, or by which a micelle structure is not substantially formed. Here, the description that a micelle structure is not substantially formed indicates that a micelle is not formed under a common condition such as in a water medium of room temperature, that is, the critical micelle concentration cannot be measured. By a polymer having such a feature, a thin polymer layer (for example, 5 nm or less) having a thickness of molecular level can be more effectively formed, and an increase in the dielectric constant of an insulating layer can be more effectively suppressed. Furthermore, the adhesion between an insulating layer and a wiring material is more effectively improved.

Furthermore, the polymer (A) used in the present disclosure is preferably polyethyleneimine having a weight-average molecular weight of from 2,000 to 1,000,000 and a cationic functional group equivalent weight of from 27 to 430, more preferably polyethyleneimine having a weight-average molecular weight of from 2,000 to 600,000 and a cationic functional group equivalent weight of from 27 to 430, and particularly preferably polyethyleneimine having a weight-average molecular weight of from 10,000 to 150,000 and a cationic functional group equivalent weight of from 27 to 400. By virtue of this aspect, the diffusion of a metal component or a plasma component into an insulating layer is more effectively suppressed and the adhesion between an insulating layer and a wiring material is further improved.

[Method of Producing Polymer (A)]

Examples of the method of producing a polymer (A) used in the present disclosure include a production method including a step of reacting a raw material polymer with a monomer containing a cationic functional group, and among them, a production method including a step of reacting a raw material polymer containing at least one of a primary nitrogen atom or a secondary nitrogen atom with a monomer containing a cationic functional group is suitable.

By the reaction described above, at least one of a tertiary nitrogen atom or a quaternary nitrogen atom can be generated from at least one of the primary nitrogen atom or the secondary nitrogen atom contained in the raw material polymer, and thus particularly, the polymer (A) which has a branching degree of 48% or more can be suitably obtained.

The reaction can be performed by mixing the raw material polymer with the monomer including a cationic functional group in a solvent such as water or an alcohol, and refluxing while heating.

The reaction time can be appropriately adjusted, and is, for example, preferably from 1 to 24 hours, and more preferably from 2 to 12 hours.

The raw material polymer in the method described above contains preferably at least one of a primary nitrogen atom or a secondary nitrogen atom, and more preferably a raw material polymer containing a secondary nitrogen atom.

Examples of the raw material polymer containing a secondary nitrogen atom include a polyalkyleneimine that is a polymer of an alkyleneimine having from 2 to 12 carbon atoms (preferably having from 2 to 8 carbon atoms), poly (N-alkylamide), or any derivative thereof. Here, specific examples of the alkyleneimine having from 2 to 12 carbon atoms are as described above. Examples of the derivative include a polyalkyleneimine into which an anionic functional group has been introduced.

The weight-average molecular weight of the raw material polymer is not particularly limited as long as it is a weight-average molecular weight which enables production of the polymer (A) having a weight-average molecular weight of from 2,000 to 1,000,000 by a reaction with a monomer containing a cationic functional group.

For example, the weight-average molecular weight of the raw material polymer is preferably from 1,000 to 500,000, more preferably from 2,000 to 200,000, and particularly preferably from 5,000 to 150,000.

Examples of the monomer containing a cationic functional group used in the production method described above include a nitrogen-containing compound.

The cationic functional group in the monomer containing a cationic functional group used in the production method described above is preferably bonded to a protective group which is stable under the reaction condition.

By virtue of this, the reaction between the monomers containing a cationic functional group can be suppressed, and thus a polymer (A) having a higher branching degree can be produced.

As the protective group, a protective group used commonly can be used.

Examples of the protective group include a t-butoxycarbonyl group (Boc group), a benzyloxycarbonyl group, a methoxycarbonyl group, a fluorenylcarbonyl group, a formyl group, an acetyl group, a benzoyl group, a phthaloyl group, an allyl group, and a benzyl group.

As the monomer containing a cationic functional group bonded to a protective group, a nitrogen-containing compound which contains a nitrogen atom bonded to a protective group is more preferable.

Specific examples of the nitrogen-containing compound which contains a nitrogen atom bonded to a protective group include a compound represented by any one of the following Formulae (m-1) to (m-3).

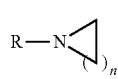
(m-1)

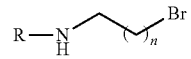
(m-2)

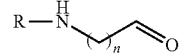
(m-3)

In Formulae (m-1) to (m-3) described above, R represents a protective group, and n represents an integer from 1 to 4.

The protective group represented by R may be any functional group which is generally used as the protective group for a nitrogen atom, and, for example, a t-butoxycarbonyl group (Boc group), a benzyloxycarbonyl group, a methoxycarbonyl group, a fluorenylcarbonyl group, a formyl group, an acetyl group, a benzoyl group, a phthaloyl group, an allyl group, and a benzyl group are preferable.

The nitrogen-containing compound (monomer) which contains a nitrogen atom bonded to a protective group is more preferably a compound represented by Formula (m-1) described above, and particularly preferably a compound (protected aziridine) represented by Formula (m-1) described above in which n is 1.

As the method of producing a polymer of the present disclosure, a production method including a step of reacting a raw material polymer (for example, a polyalkyleneimine which is a polymer of an alkyleneimine having from 2 to 12 carbon atoms) containing a secondary nitrogen atom with a compound represented by Formula (m-1) described above is particularly preferable.

The method of producing a polymer (A) may include another step such as a step of deprotecting a cationic functional group containing a protective group introduced into a polymer, if necessary.

[Polyvalent Carboxylic Acid Compound (B)]

In a substrate intermediary body of the present disclosure, a polyvalent carboxylic acid compound (B) having two or more carboxyl groups per molecule is used. Specifically, the polyvalent carboxylic acid compound (B) is used for the generation of a reaction product contained in an adhesion layer of the substrate intermediary body.

The polyvalent carboxylic acid compound (B) is not particularly limited as long as it is a carboxylic compound having two or more carboxyl groups per molecule, and may be aromatic carboxylic acid having an aromatic ring, aromatic carboxylic acid in which a carboxyl group is bonded to an aromatic ring, aliphatic carboxylic acid in which a carboxyl group is bonded to a carbon chain, or carboxylic acid in which a carboxyl group is bonded to an aromatic ring and a carbon chain.

The aromatic ring is not particularly limited as long as it is a ring structure exhibiting aromaticity, and examples thereof include a benzene-based aromatic ring such as a benzene ring or a naphthalene ring. For example, in a case in which the ring structure is a benzene ring, the aromatic ring may be a biphenyl structure, a benzophenone structure, or a diphenyl ether structure or the like.

Among them, the polyvalent carboxylic acid compound (B) is preferably aromatic carboxylic acid, more preferably trivalent and higher aromatic carboxylic acid, and still more preferably trivalent or tetravalent aromatic carboxylic acid. By using the trivalent and higher aromatic carboxylic acid, higher heat resistance (400° C. or higher) can be obtained.

Examples of the trivalent and higher aromatic carboxylic acid include 1,3,5-benzenetricarboxylic acid, pyromellitic acid, 4,4'-oxydiphthalic acid, 3,3',4,4'-benzophenone tetracarboxylic acid, and 3,3',4,4'-biphenyltetracarboxylic acid.

The derivative of the polyvalent carboxylic acid compound (B) may be used for the generation of the reaction product contained in the adhesion layer of the substrate intermediary body. Examples of the derivative of the polyvalent carboxylic acid compound (B) include a polyvalent carboxylic acid compound (B) which is wholly or partially made anhydrous, and a polyvalent carboxylic acid compound (B) which is wholly or partially etherified.

<Substrate>

A substrate has a hole (through hole) in which a conductor is disposed in a thickness direction. An electrode as the conductor is disposed or formed in the hole, and thus the substrate serves as a through-hole via electrode substrate having a through electrode (TSV (Through silicon via)).

The substrate used in the present disclosure is not particularly limited, and examples thereof include a semiconductor substrate such as a silicon wafer, a glass substrate, a quartz substrate, a stainless steel substrate, and a plastic substrate. The shape of the substrate is not also particularly limited, and may be any of a plate shape or a dish shape.

The substrate used in the present disclosure has a hole in a thickness direction, and the hole may not be a through hole. In a case in which the hole of the substrate is not a through hole, an electrode as a conductor is disposed or formed in the hole, and a surface opposite to a surface in which the hole of the substrate is formed then polished or etched until the hole is exposed, as a result of which a through hole is formed in the substrate, thereby producing a through-hole via electrode substrate having a through electrode.

<Adhesion layer>

An adhesion layer is a layer containing a reaction product of a polymer (A) having a cationic functional group and having a weight-average molecular weight of from 2,000 to 1,000,000 and a polyvalent carboxylic acid compound (B) having two or more carboxyl groups per molecule or a derivative thereof. The adhesion layer is a layer formed on the wall surface of the hole of the substrate, and providing adhesion between the wall surface of the hole and the conductor.

The adhesion layer is a layer containing the reaction product, which can improve the adhesion between the substrate and the conductor as a wiring material and suppress the leakage current of the adhesion layer. The thickness of the adhesion layer can be adjusted, which can provide a thin uniform layer.

The reaction product contained in the adhesion layer contains preferably at least one of an amide bond or an imide bond, and more preferably an imide bond.

FT-IR (Fourier transform IR spectroscopy) can confirm the presence or absence of the vibrating peaks of an amide bond and an imide bond, thereby determining whether the reaction product contained in the adhesion layer contains at least one of the amide bond or the imide bond. The imide bond may be determined from the presence or absence of the vibrating peaks of 1770 cm$^{-1}$ and 1720 cm$^{-1}$, and the amide bond may be determined from the presence or absence of the vibrating peaks of 1650 cm$^{-1}$ and 1520 cm$^{-1}$.

The thickness of the adhesion layer is not particularly limited, and, for example, the thickness of one layer may be from 0.5 nm to 100 nm, and preferably from 1 nm to 30 nm.

When the adhesion layer includes plural layers as described below, the thickness of one layer may be from 0.5 nm to 100 nm, and preferably from 1 nm to 30 nm. Furthermore, in a case in which plural adhesion layers are contained, the total thickness of the adhesion layers is the thickness of one adhesion layer x the number of the layers.

<Insulating Layer>

The substrate intermediary body of the present disclosure preferably further includes an insulating layer provided between the substrate and the adhesion layer. The insulating layer is not particularly limited as long as it has insulation properties, and is a layer which is not peeled off from the adhesion layer. The insulating layer may be an organic polymer film, an oxide film, or a nitride film. Examples thereof include an oxide film made of $SiO_2$, mesoporous silica or nanoporous silica or the like, a nitride film made of silicon nitride or the like, an organic polymer film made of benzocyclobutene, silicone, an epoxy resin, polyimide, polyamide imide, polyether ether ketone, or norbornene or the like, or a composite film made of a composite material containing two or more kinds thereof. For example, the insulating layer may be made of a porous material such as porous silica, a polymer or a composite material of silica and polyimide.

The pore radius of the insulating layer containing a porous material such as porous silica is not particularly limited, and is preferably from 0.5 nm to 3.0 nm, and more preferably from 1.0 nm to 2.0 nm from the viewpoint that the pore coatability effect provided by the polymer (A) is more effectively exhibited.

The insulating layer preferably contains porous silica, and has a silanol residue derived from porous silica on the surface. In this case, the pore coatability effect provided by the polymer (A) is further improved by the interaction of the silanol residue and a cationic functional group contained in the polymer (A) moiety.

As the porous silica, porous silica which is commonly used in an insulating layer of a semiconductor device can be used without particular limitation. Examples thereof may include an oxide having a uniform mesopore in which self-organization of an organic compound and an inorganic compound is used and which is hydrothermally synthesized in a sealed heat resistant container using a surfactant and silica gel described in WO 91/11390 pamphlet, or the like, and porous silica produced from a surfactant and a condensate of an alkoxysilane described in Nature, Vol. 379, p. 703, 1996 or Supramolecular Science, Vol. 5, p. 247, 1998.

As the porous silica, porous silica (for example, porous silica formed using a composition containing a specific siloxane compound) described in WO 2009/123104 pamphlet (Paragraphs from [0009] to [0187]) or WO 2010/137711 pamphlet (Paragraphs from [0043] to [0088]) is also preferably used.

In a case in which the substrate intermediary body of the present disclosure includes the insulating layer, the configuration examples of the substrate, the insulating layer, and the adhesion layer are as follows:

configuration example 1: substrate/insulating layer/adhesion layer; and configuration example 2: substrate/adhesion layer 1 (first adhesion layer)/insulating layer/adhesion layer 2 (second adhesion layer).

In the configuration examples 1 and 2, each of the adhesion layer and the adhesion layer 2 is adhered to an electrode which is a conductor to be described below. As with the configuration example 2, plural (two or more) adhesion layers may be provided. At this time, the plural adhesion layers (for example, the adhesion layer 1 and the adhesion layer 2) may be made of the same material, and may be made of different materials.

The adhesion layer may have insulation properties to serve as the insulating layer. In order to apply insulation properties to the adhesion layer, a material having insulation properties such as a polymer or a composite material of silica and polyimide may be added to the adhesion layer.

The thickness of the insulating layer is not particularly limited, and may be, for example, from 50 nm to 20 μm, preferably from 100 nm to 10 μm, more preferably from 200 nm to 10 μm, still more preferably from 0.5 μm to 10 μm, and particularly preferably from 1 μm to 5 μm.

[Through-Hole Via Electrode Substrate]

A through-hole via electrode substrate of the present disclosure includes the substrate having a hole in a thickness direction, an electrode as a conductor disposed in the hole, and the adhesion layer formed between the electrode and a wall surface of the hole. That is, the through-hole via electrode substrate of the present disclosure includes the above-mentioned substrate intermediary body and the electrode as the conductor disposed in the hole of the substrate.

<Electrode>

An electrode is a conductor being disposed in the hole of the substrate. The conductor is not particularly limited as long as it is a member having electrical conductivity, and, for example, conductive silicon, a conductive polymer, and a conductor metal used commonly or the like may be used. Examples of the conductor metal include metal elements such as Cu, Al, Ni, Fe, Sn, Cr, Pt, Zn, Mg, Ta, Ti, Mn, Co, W, and Ru, and besides the conductor metal, nonmetal elements such as N and 0 may be contained.

The conductor containing the conductor metal preferably contains copper as the main component.

Here, the "main component" refers to the component of which the content ratio (atom %) is the highest.

The content ratio is preferably 50 atom % or more, more preferably 80 atom % or more, and still more preferably 90 atom % or more.

<Barrier Layer>

A barrier layer may be provided between the electrode and the adhesion layer. By providing the barrier layer, the diffusion of metal components into the adhesion layer or the insulating layer can be more effectively suppressed. The barrier layer is preferably a layer made of a titanium compound such as titanium nitride, a tantalum compound such as tantalum nitride, a ruthenium compound, or a manganese compound.

The thickness of the barrier layer is not particularly limited, and may be from 1 nm to 100 nm.

The barrier layer may be a polyimide film. A method of forming a polyimide film is not particularly limited, and the polyimide film can be formed by gas phase polymerization or the like. The thickness of the polyimide film is not particularly limited, and may be from 100 nm to 500 nm.

In a case in which the through-hole via electrode substrate of the present disclosure includes the barrier layer, the configuration examples of the substrate, the insulating layer, the adhesion layer, the barrier layer, and the electrode are as follows:

configuration example 1: substrate/insulating layer/adhesion layer/barrier layer/electrode; and configuration example 2: substrate/adhesion layer 1/insulating layer/adhesion layer 2/barrier layer/electrode.

[Through-Hole Via Electrode Formation Method]

Hereinafter, a through-hole via electrode formation method of the present disclosure will be described. The through-hole via electrode formation method according to the present disclosure includes a first step of forming a film containing a polymer (A) having a cationic functional group and having a weight-average molecular weight of from 2,000 to 1,000,000 on the wall surface of a hole included in the thickness direction of a substrate, a second step of applying a polyvalent carboxylic acid compound (B) having two or more carboxyl groups per molecule or a derivative thereof onto the film containing the polymer (A), a step of heating the film containing the polymer (A) and the polyvalent carboxylic acid compound (B) or a derivative thereof at from 200° C. to 425° C., thereby forming an adhesion layer after the second step, and a step of forming an electrode in the hole on which the adhesion layer is formed.

The adhesion layer is formed as a film on the wall surface of the hole included in the thickness direction of the substrate, and a conductor such as copper is then provided in the hole on which the adhesion layer is formed, thereby forming the electrode. This provides excellent adhesion between the substrate and the conductor.

(Step 1)

First, a film containing a polymer (A) having a cationic functional group and having a weight-average molecular weight of from 2,000 to 1,000,000 is formed on the wall surface of a hole included in the thickness direction of a substrate (first step).

In order to form the film containing the polymer (A) on the wall surface of the hole, a composition A containing the polymer (A) may be applied onto the wall surface of the hole.

The pH of the composition A is preferably from 2 to 12, and more preferably from 7 to 11.

In order to adjust the pH of the composition A to the acidic side, the composition A may contain at least one kind of acid.

The acid is not particularly limited, and examples of the acid include a monocarboxylic acid compound.

Examples of the monocarboxylic acid compound include aliphatic monocarboxylic acid compounds (for example, formic acid, acetic acid, propionic acid, butyric acid, methoxyacetic acid, ethoxyacetic acid, lactic acid, glycolic acid, and glyceric acid or the like) and aromatic monocarboxylic acid compounds (for example, benzoic acid, picolinic acid, salicylic acid, and 3,4,5-trihydroxybenzoic acid or the like).

The composition A can contain a solvent, in addition to the polymer (A), if necessary.

The solvent is not particularly limited as long as it is a solvent which uniformly dissolves the polymer (A) and hardly forms a micelle. Examples of such a solvent may include water (preferably, ultrapure water) and water-soluble organic solvents (for example, alcohols or the like). In the present disclosure, from the viewpoint of micelle forming property, it is preferable to use water or a mixture of water and a water-soluble organic solvent, as the solvent. The boiling point of the solvent is not particularly limited, and is preferably 210° C. or lower, and more preferably 160° C. or lower. When the boiling point of the solvent is within the above range, the solvent can be easily removed at a low temperature.

With regard to the components of the composition, the components of a composition described, for example, in WO 2010/137711 pamphlet and WO 2012/033172 pamphlet can also be referred to, as appropriate.

The concentration of the polymer (A) in the composition A is preferably from 0.1% by mass to 30% by mass, and more preferably from 0.25% by mass to 10% by mass.

Before the step 1, the wall surface of the hole of the substrate may be subjected to a pretreatment. Examples of the pretreatment include an oxygen plasma treatment and an ozone UV treatment. By the pretreatment, a contact angle between the treated surface and the composition A can be reduced.

Cleaning may be performed using water or the like in order to remove an extra composition after the step 1, and heating may be performed at from 70° C. to 125° C. in order to remove a solvent.

(Step 2)

A polyvalent carboxylic acid compound (B) having two or more carboxyl groups per molecule or a derivative thereof is applied onto the film containing the polymer (A) formed as described above (second step).

In order to apply the polyvalent carboxylic acid compound (B) or the derivative thereof onto the film containing the polymer (A), a composition B containing the polyvalent carboxylic acid compound (B) may be applied onto the film containing the polymer (A).

Examples of the polyvalent carboxylic acid compound (B) include acids such as dicarboxylic acids (such as oxalic acid, malonic acid, succinic acid, glutaric acid, adipic acid, pimelic acid, maleic acid, and fumaric acid); tricarboxylic acids (such as trimellitic acid, trimesic acid, and tricarballylic acid); oxydicarboxylic acids (such as malic acid and tartaric acid); oxytricarboxylic acids such as citric acid; and aminocarboxylic acids (such as aspartic acid and glutamic acid).

The acid contains a carboxyl group as a functional group per molecule, the carboxyl group forming a bond between the carboxyl group and the polymer (A) during heating. Thereby, particularly, in a case in which a plasma treatment (for example, plasma cleaning or plasma CVD) is performed, the plasma resistance of the adhesion layer containing the polymer (A) can be improved.

In the acid, the number of the carboxyl groups per molecule is preferably 2 or more, and more preferably 3 or more.

In a case in which the adhesion layer contains polyalkyleneimine described above (preferably, polyethyleneimine), the carboxyl group reacts with at least one of a primary amino group or a secondary amino group (imino group) in polyalkyleneimine, thereby forming an amide bond or an imide bond.

From the viewpoint of improving the plasma resistance of the polymer layer, preferable examples of the acid include, specifically, polyvalent carboxylic acids such as naphthalene tetracarboxylic acid, biphenyl tetracarboxylic acid, benzophenone tetracarboxylic acid, benzene hexacarboxylic acid, oxydiphthalic acid, pyromellitic acid, trimellitic acid, trimesic acid, ethylenediamine tetraacetic acid, and citric acid, and naphthalene tetracarboxylic acid, biphenyl tetracarboxylic acid, benzophenone tetracarboxylic acid, benzene hexacarboxylic acid, oxydiphthalic acid, and pyromellitic acid are preferable.

The concentration of the polyvalent carboxylic acid compound (B) in the composition B is preferably from 0.1 mmol/L to 200 mmol/L, and more preferably from 0.3 mmol/L to 150 mmol/L.

The composition B can contain a solvent, in addition to the polyvalent carboxylic acid compound (B), if necessary.

The solvent of the composition B is not particularly limited as long as it dissolves the polyvalent carboxylic acid compound (B), and is preferably an acid having high solubility of the polyvalent carboxylic acid compound (B). In a case in which a more amount of carboxylic acid having high valence as the polyvalent carboxylic acid compound (B) is contained in the composition B, the solvent is preferably water or ethanol or the like. In a case in which a more amount of an esterified or anhydrous derivative of the polyvalent carboxylic acid compound (B) is contained in the composition B, the solvent is preferably isopropyl alcohol (IPA) or the like.

From the viewpoint of suppressing the oxidization of the conductor, it is also preferable that the composition B contains a reducing agent or a compound having a reducing action. Examples of the reducing agent or the compound having a reducing action include formalin.

From the viewpoints of preventing the cleavage of a carbon-carbon bond or the like in the polymer (A) and suppressing the separation of the polymer (A) from the insulating layer, it is preferable that the content of an oxidative compound (for example, hydrogen peroxide or nitric acid) in the composition B is 10% by mass or less, and it is more preferable that the composition B does not contain an oxidative compound.

The composition B preferably has an ionic strength of 0.003 or more, and preferably 0.01 or more.

In a case in which the ionic strength is 0.003 or more, the composition B dissolves the polymer (A) more easily, and besides, the composition B does not significantly damage the interaction between the insulating layer and the polymer (A), which is thus preferable.

The upper limit of the ionic strength is not particularly limited, and it is enough to have an ionic strength of a concentration capable of dissolving an ionic compound.

Note that, the ionic strength is represented by the following Formula.

$$\text{Ionic strength} = \frac{1}{2} \times \Sigma(c \times Z^2)$$

(wherein c represents a molar concentration of the ionic compound contained in the coating liquid, and Z represents an ionic valence of the ionic compound contained in the coating liquid.)

In order to adjust the ionic strength, an ionic compound such as the acid described above or an organic base (ammonia, pyridine, and ethylamine or the like) can also be added, if necessary.

Furthermore, a polymer (for example, polyethyleneimine) which catches metal element ions may be added.

It is also preferable that the composition B has a pH at 25° C. of 6 or less (preferably, 5 or less).

In this case, the lower limit of the pH of the composition B is not particularly limited, and the pH is preferably 1 or more, and more preferably 2 or more.

When the pH is 1 or more, the dissolution of the insulating layer can be further reduced, and thus, the polymer adhered to the insulating layer can be more suitably maintained.

The pH of the coating liquid is preferably from 1 to 6, more preferably from 2 to 5, and particularly preferably from 2 to 4.

It is also preferable that the composition B (particularly, the composition B having a pH at 25° C. of 6 or less) contains at least one kind of acid besides the polyvalent carboxylic acid compound (B).

The acid is not particularly limited, and is preferably an acid which is less likely to pollute or destroy the insulating layer. Specific examples of the acid include monocarboxylic acids such as formic acid and acetic acid; oxymonocarboxylic acids such as hydroxybutyric acid, lactic acid, and salicylic acid; organic acids such as barbituric acid; and inorganic acids such as hydrochloric acid, nitric acid, and phosphoric acid.

It is also preferable that the acid is an acid which contains, per molecule, a moiety which blocks active species (for example, plasma active species such as radicals, ions, or electrons). By having such a configuration, particularly, in the case of performing a plasma treatment (for example, plasma cleaning or plasma CVD), the plasma resistance of the adhesion layer containing the polymer (A) can be improved.

The moiety which blocks active species is not particularly limited, and specifically, a functional group having a conjugated system is preferable. Specific examples thereof include an aromatic group and a silicon atom.

Cleaning may be performed using water or the like in order to remove an extra composition after the step 2.

(Step 3)

Next, after the step 2 (second step), an adhesion layer is formed by heating the film containing the polymer (A) and the polyvalent carboxylic acid compound (B) or the derivative thereof at from 200° C. to 425° C. Specifically, the polymer (A) contained in the film obtained after the step 1, and the polyvalent carboxylic acid compound (B) or the derivative thereof react with each other during heating, thereby obtaining a reaction product, and an adhesion layer containing the reaction product is formed. As a result, the leakage current derived from the cationic functional group can be suppressed, and the corrosion of the conductor caused by the polyvalent carboxylic acid compound (B) can be suppressed.

The temperature denotes the temperature of the wall surface of the hole of the substrate to which the composition A containing the polymer (A) is applied. The temperature is preferably from 250° C. to 400° C., and more preferably from 300° C. to 400° C.

The pressure (the pressure of an atmosphere, to which the film is exposed at the time of heating) when performing heating in the step 3 is not particularly limited, and the absolute pressure is preferably more than 17 Pa but equal to or less than the atmospheric pressure.

The absolute pressure is more preferably 1,000 Pa or more but equal to or less than the atmospheric pressure, still more preferably 5,000 Pa or more but equal to or less than the atmospheric pressure, and particularly preferably 10,000 Pa or more but equal to or less than the atmospheric pressure.

Heating in the step 3 can be carried out by an ordinary method using an oven or a hot plate. As the oven, for example, an SPX-1120 manufactured by APEX Co., Ltd., or a VF-1000LP manufactured by Koyo Thermo Systems Co., Ltd. can be used.

Heating in the present step may be carried out under an air atmosphere, or heating may be carried out under an inert gas (nitrogen gas, argon gas, and helium gas or the like) atmosphere. The inert gas atmosphere is preferably a nitrogen gas atmosphere.

The heating time in the step 3 is not particularly limited, and is, for example, 1 hour or less, preferably 30 minutes or less, more preferably 10 minutes or less, and particularly preferably 5 minutes or less. The lower limit of the heating time is not particularly limited, and can be, for example, 0.1 minutes.

The film obtained after the step 2 may be irradiated with ultraviolet rays (UV) when performing heating in the step 3, and for example, the film may be irradiated with excimer UV (14 mW/cm$^2$) having a wavelength of 172 nm, or the like. The formation of the amide bond or imide bond of the adhesion layer is inferred to be promoted by UV irradiation. In a case in which the film is irradiated with ultraviolet rays, the film is preferably irradiated with UV simultaneously with the heating of the step 3, that is, while being heated.

(Step 4)

After the adhesion layer is formed, an electrode is formed in the hole in which the adhesion layer is formed. As the forming method, a method performed according to common TSV may be used. For example, copper may be adhered according to a metal CVD method, a sputtering method or an electrolytic plating method, thereby forming an electrode. The electrode adhered on the substrate may be subjected to a CMP treatment if necessary, thereby smoothing the electrode.

(Formation of Insulating Layer)

In a case in which the insulating layer is provided between the substrate and the adhesion layer, the insulating layer is formed on the wall surface of the hole of the substrate before the step 1, and the steps 1 to 4 are then performed. For example, the insulating layer may be formed by applying a porous silica forming composition containing porous silica or the like to the wall surface, followed by performing heating and ultraviolet irradiation.

(Formation of Barrier Layer)

In a case in which the barrier layer is provided between the adhesion layer and the electrode, the barrier layer is formed after the step 3, and the step 4 is then performed. A method of forming the barrier layer is not particularly limited, and examples thereof include methods commonly performed such as a chemical vapor deposition method (CVD), a physical vapor deposition method (PVD), an electrochemical vapor deposition method (ECD), and a sputtering technique.

The substrate used for forming a through-hole via electrode has a hole in a thickness direction, and the hole may be a through hole or may not be a through hole. In a case in which the hole of the substrate is not a through hole, an electrode is formed, and a surface opposite to a surface in which the hole is formed in the substrate is then polished or etched until the hole is exposed, which allows a through hole to be formed in the substrate.

Figure 2:
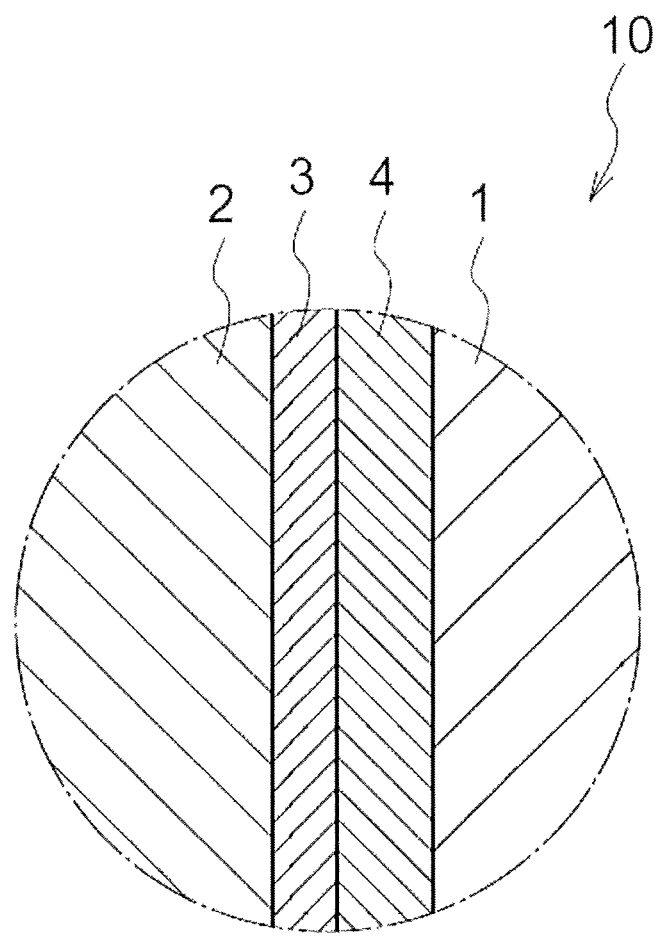
FIG. 2 is an enlarged sectional view schematically showing the cross section of the through-hole via electrode substrate according to the present disclosure.

By the through-hole via electrode formation method according to the present disclosure, for example, a through-hole via electrode substrate shown in FIGS. 1 and 2 can be formed. FIG. 1 is a conceptual sectional view schematically showing the cross section of a through-hole via electrode substrate according to the present disclosure, and FIG. 2 is an enlarged sectional view of a circled portion in FIG. 1.

By the through-hole via electrode formation method according to the present embodiment, a through-hole via electrode substrate 10 can be obtained, which includes a substrate 1, an insulating layer 4, an adhesion layer 3, and an electrode 2 formed in this order.

Figure 3:
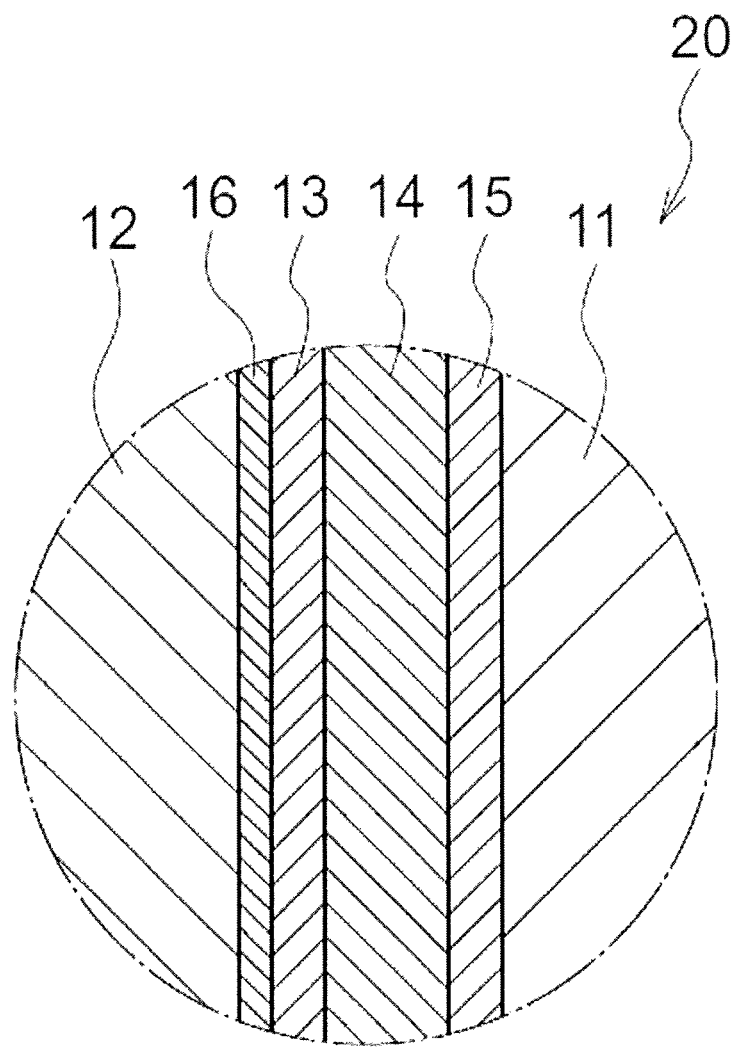
FIG. 3 is an enlarged sectional view schematically showing the cross section of a through-hole via electrode substrate according to another embodiment.

By the through-hole via electrode formation method according to the present disclosure, for example, a through-hole via electrode substrate shown in FIG. 3 may be formed instead of the through-hole via electrode substrate shown in FIGS. 1 and 2. FIG. 3 is an enlarged sectional view schematically showing the cross section of the through-hole via electrode substrate according to another embodiment.

By the through-hole via electrode formation method according to the present embodiment, a through-hole via electrode substrate 20 can be obtained, which includes a substrate 11, a first adhesion layer 15, an insulating layer 14, a second adhesion layer 13, a barrier layer 16, and an electrode 12 formed in this order.

The method of applying the above-mentioned composition A or composition B onto the wall surface of the hole is not particularly limited, and a method used commonly can be used. For example, a dipping method (for example, see the specification of U.S. Pat. No. 5,208,111), a spraying method (for example, see Schlenoff et al., Langmuir, 16 (26), p. 9968, 2000 or Izquierdo et al., Langmuir, 21 (16), p. 7558, 2005), and a spin coating method (for example, see Lee et al., Langmuir, 19 (18), p. 7592, 2003 or J. Polymer Science, part B, polymer physics, 42, p. 3654, 2004) or the like can be used.

[Other Components]

Each of the content of sodium and the content of potassium in the compositions A and B used in the present disclosure is preferably 10 ppb by mass or less on an elemental basis. Each of the content of sodium and or the content of potassium is 10 ppb by mass or less on an elemental basis, and thus the occurrence of a trouble in electrical properties of a semiconductor device such as operation failure of a transistor can be suppressed.

Furthermore, it is preferable that the compositions A and B do not contain a compound which brings about the corrosion or dissolution of the insulating layer. Specifically, for example, if a fluorine compound or the like is contained in the composition, the insulating layer is dissolved, and thus the insulation properties of the insulating layer are damaged and the relative dielectric constant thereof increases in some cases particularly in a case in which the main material of the insulating layer is an inorganic compound such as silica.

The compositions A and B preferably contain only a compound which has a boiling point of 210° C. or lower and preferably 160° C. or lower, or only a compound which does not exhibit degradability even heated up to 250° C., as a component other than the polymer (A).

The "compound that does not exhibit degradability even heated up to 250° C." is a compound of which the weight change after being held at 250° C. under nitrogen atmosphere for 1 hour is less than 50% with respect to the weight measured at 25° C.

The composition A preferably has an average particle diameter measured by a dynamic light scattering method of 150 nm or less.

If the average particle diameter is 150 nm or less, the adhesion with the electrode is further improved, and thus the diffusion of a metal component or a plasma component into an insulating layer is further suppressed.

The average particle diameter in the present disclosure is measured by a dynamic light scattering method using ELSZ-2 manufactured by OTSUKA ELECTRONICS CO., LTD., and obtained as a cumulant average particle diameter. The measurement is performed under a condition of, for example, a solution concentration of from 0.1% to 1.0%, a temperature of from 23° C. to 26° C., a cumulative number of 70 times, and a repeat count of 3 times or the like. Stable measurement can be performed by adding an electrolyte such as NaCl if necessary.

The average particle diameter is more preferably 100 nm or less, still more preferably 50 nm or less, yet still more preferably 30 nm or less, and particularly preferably 10 nm or less from the viewpoint that the adhesion with the electrode is further improved and the diffusion of a metal component or a plasma component into an insulating layer is further suppressed.

The pH of the composition A is not particularly limited, and the pH is preferably equal to or higher than an isoelectric point of the insulating layer from the viewpoint of the adsorptivity of the polymer (A) to the insulating layer. The pH of the composition A is preferably in a pH range in which the cationic functional group is in a cationic state. If the composition A has the pH described above, the polymer (A) is more efficiently adsorbed on the insulating layer by the electrostatic interaction between the insulating layer and the polymer (A).

The isoelectric point of the insulating layer is the isoelectric point exhibited by a compound constituting the insulating layer, and for example, in a case in which a compound constituting the insulating layer is porous silica, the isoelectric point is near pH 2 to 4 (25° C.).

The pH range in which the cationic functional group is in a cationic state is such that the pH of the composition A is equal to or less than the $pK_a$ of a polymer containing a cationic functional group. For example, in a case in which a polymer containing a cationic functional group is polyallylamine, the $pK_a$ is from 8 to 9, and in a case of polyethyleneimine, the $pK_a$ is from 7 to 12.

That is, the pH of the composition A can be appropriately selected depending on the kind of the compound constituting the insulating layer and the kind of the polymer, and the pH is, for example, preferably from 2 to 12, and more preferably from 7 to 11.

The pH (25° C.) is measured using a pH measuring device used commonly.

EXAMPLES

Hereinafter, the present invention will be described in more detail with reference to Examples, but the present invention is not limited to these Examples.

Hereinafter, as "water", ultrapure water (Milli-Q water manufactured by Millipore Corporation, resistance: 18 MO. cm or less (25° C.)) was used.

As described below, polyethyleneimine 1 was synthesized, and subsequently, a composition A containing the obtained polyethyleneimine 1 was prepared. Details are described below.

<Synthesis of Polyethyleneimine 1>

(Synthesis of Modified Polyethyleneimine 1)

Modified polyethyleneimine 1 was synthesized according to the following Reaction Scheme 1, using polyethyleneimine as the starting material. It should be noted that the polymer structures in the following Reaction Scheme 1 and Reaction Scheme 2 are structures which are represented schematically, and the configuration of the tertiary nitrogen atom and the secondary nitrogen atom, and the proportion of the secondary nitrogen atom to be substituted by a Boc-aminoethyl group as described below may change variously, depending on the synthesis condition.

-Reaction scheme 1-

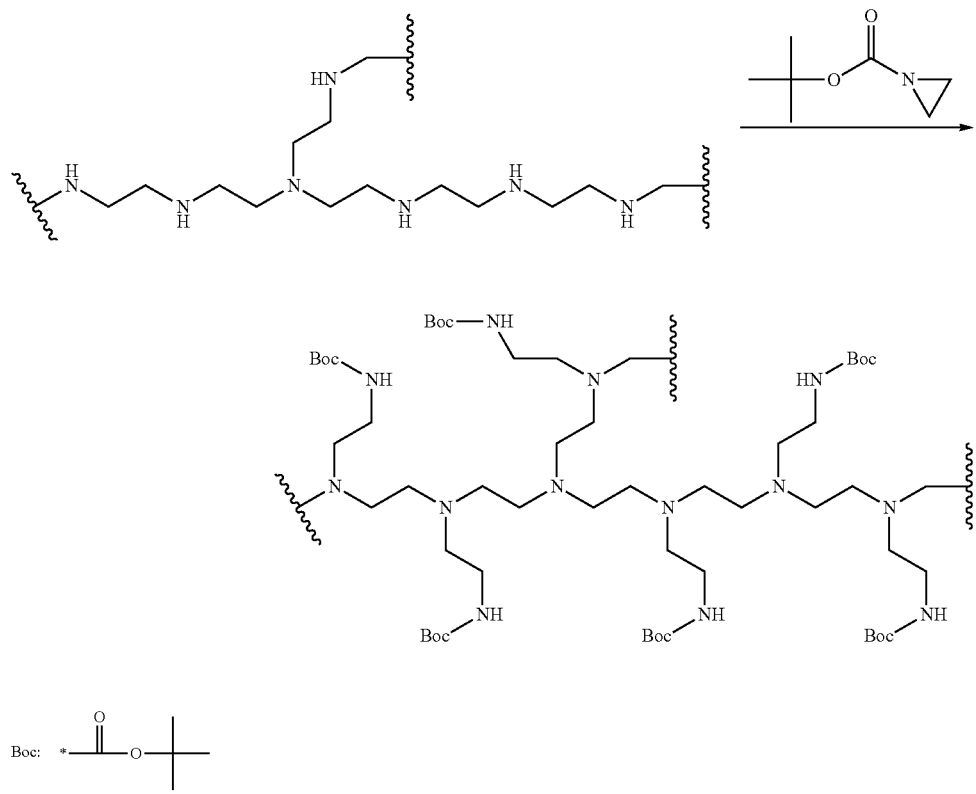

The detailed operation of Reaction Scheme 1 above is as follows.

61.06 g of polyethyleneimine (50% aqueous solution) manufactured by MP Biomedicals, LLC. was dissolved in 319 mL of isopropanol, and then 102 g (710 mmol) of N-t-butoxycarbonyl (in Examples, the "t-butoxycarbonyl group" is also referred to as "Boc") aziridine was added thereto.

The obtained mixture was heated under reflux for 3 hours, thereby obtaining modified polyethyleneimine 1 having a structure in which a Boc-aminoethyl group was introduced into polyethyleneimine. It was confirmed, by thin layer chromatography (TLC), that N-Boc aziridine as the raw material was not present. Then, a small amount of the product was sampled, and the structure was confirmed by $^1$H-NMR. From the $^1$H-NMR results, the introduction rate of the Boc-aminoethyl group with respect to polyethyleneimine was calculated to be 95%.

—NMR Measurement Results of Modified Polyethyleneimine 1—

$^1$H-NMR(CD$_3$OD);δ3.3-3.0(br.s,2),2.8-2.5(Br.s,6.2),1.45 (s,9)

(Synthesis of Polyethyleneimine 1)

Polyethyleneimine 1 was synthesized according to the following Reaction Scheme 2, using the modified polyethyleneimine 1 as the starting material.

-Reaction scheme 2-

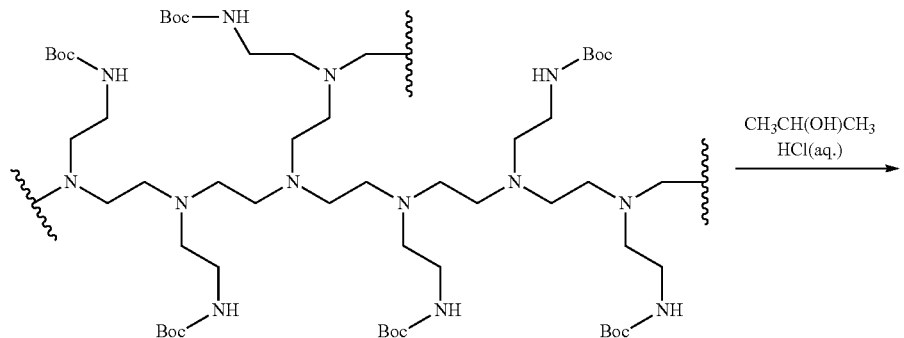

-continued

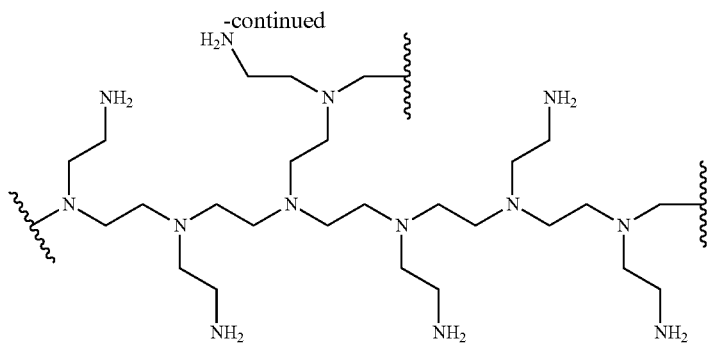

The detailed operation of Reaction Scheme 2 above is as follows.

124 mL of 12N hydrochloric acid was slowly added to the isopropanol solution of the modified polyethyleneimine 1. The obtained solution was stirred under heating at 50° C. for 4 hours, while being careful about generation of gas. Together with the generation of gas, a gum-like reaction product was generated in the reaction system. After the completion of the generation of gas, the reaction system was cooled. After cooling, the solvent separated from this gum-like reaction product was removed, and the obtained reaction product was then washed three times with 184 mL of methanol. The washed reaction product was dissolved in water, and chlorine ions were removed by using an anion exchange polymer, thereby obtaining an aqueous solution containing 58 g of polyethyleneimine 1 (highly branched polyethyleneimine 1).

—NMR Measurement Results of Polyethyleneimine 1—
$^1$H-NMR(D$_2$O); δ2.8-2.4(br.m)
$^{13}$C-NMR(D$_2$O); δ((integration ratio)57.2(1.0),54.1 (0.38),52.2(2.26),51.6(0.27),48.5(0.07),46.7(0.37),40.8 (0.19),38.8(1.06).

With regard to the polyethyleneimine 1, the weight-average molecular weight, the molecular weight distribution, the cationic functional group (primary nitrogen atom, secondary nitrogen atom, tertiary nitrogen atom, and quaternary nitrogen atom) equivalent weight, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were measured, respectively.

As a result, the weight-average molecular weight was 40,575; the molecular weight distribution was 17.47; the cationic functional group equivalent weight was 43; the amount of primary nitrogen atom was 46% by mole; the amount of secondary nitrogen atom was 11% by mole; the amount of tertiary nitrogen atom was 43% by mole; the amount of quaternary nitrogen atom was 0% by mole, and the branching degree was 80%.

Here, the cationic functional group equivalent weight is a value of the molecular weight with respect to one cationic functional group, and can be calculated based on the polymer structure.

The amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were determined as follows. That is, the polymer sample (polyethyleneimine 1) was dissolved in heavy water, and with regard to the obtained solution, $^{13}$C-NMR measurement was performed at 80° C., using an AVANCE 500 type nuclear magnetic resonance apparatus, manufactured by Bruker Corporation, according to the single pulse inverse gated decoupling method. Based on the measurement results, analysis was conducted to determine what type of amine (nitrogen atom) to which each of the carbon atom bonds, and the above amounts and the branching degree were calculated based on the integrated value thereof. The assignment is described in European Polymer Journal, vol. 9, page 559, 1973 or the like.

The weight-average molecular weight and the molecular weight distribution were measured using an analyzer Shodex GPC-101 and using a column Asahipak GF-7M HQ, and calculated using polyethylene glycol as the reference standard. As the eluent, an aqueous solution having an acetic acid concentration of 0.5 mol/L and a sodium nitrate concentration of 0.1 mol/L was used. However, as is known in the Mark-Houwink-Sakurada formula, the calibration curve of GPC also changes as the branching degree increases, and thus, the obtained weight-average molecular weight and molecular weight distribution should only be considered as numerical values in terms of polyethylene glycol.

Here, the amount (% by mole) of primary nitrogen atom, the amount (% by mole) of secondary nitrogen atom, the amount (% by mole) of tertiary nitrogen atom, and the amount (% by mole) of quaternary nitrogen atom are amounts represented by the following formulae A to D, respectively. The branching degree was determined according to the following Formula E.

Amount (% by mole) of primary nitrogen atom=
(molar number of primary nitrogen atom/(molar number of primary nitrogen atom+molar number of secondary nitrogen atom+molar number of tertiary nitrogen atom+molar number of quaternary nitrogen atom))×100   Formula A Amount (% by mole) of secondary nitrogen atom=
(molar number of secondary nitrogen atom/ (molar number of primary nitrogen atom+molar number of secondary nitrogen atom+molar number of tertiary nitrogen atom+molar number of quaternary nitrogen atom))×100   Formula B Amount (% by mole) of tertiary nitrogen atom=(molar number of tertiary nitrogen atom/(molar number of primary nitrogen atom+molar number of secondary nitrogen atom+molar number of tertiary nitrogen atom+molar number of quaternary nitrogen atom))×100   Formula C Amount (% by mole) of quaternary nitrogen atom=
(molar number of quaternary nitrogen atom/
(molar number of primary nitrogen atom+molar
number of secondary nitrogen atom+molar
number of tertiary nitrogen atom+molar number
of quaternary nitrogen atom))×100   Formula D Branching degree (%)=((amount (% by mole) of
tertiary nitrogen atom+amount (% by mole) of
quaternary nitrogen atom)/(amount (% by mole)
of secondary nitrogen atom+amount (% by
mole) of tertiary nitrogen atom+amount (% by
mole) of quaternary nitrogen atom)×100   Formula E <Preparation of Composition A>

To the aqueous solution of polyethyleneimine 1 (weight-average molecular weight: 40,575, cationic functional group equivalent weight: 43) obtained as described above, water was added and mixed, thereby obtaining a composition A.

In the composition A, water was added and mixed such that the concentration of the polyethyleneimine 1 in the composition became 0.25% by mass. The pH of the composition A became 9.5. The "pH" used herein is a value obtained by measurement with regard to the composition A at 25° C. (hereinafter, the same applies.). Herein, the pH of the composition A was obtained as follows. A pH meter (KR5E) manufactured by AS ONE Corporation was calibrated with a pH standard solution, and the pH meter was then immersed in the solution to be measured. The value of the pH was read when the value had stabilized automatically.

<Preparation of Composition A'>

Next, the polyethyleneimine 1 obtained as described above was changed to the same mass of polyethyleneimine 2 (polyethyleneimine, manufactured by MP Biomedicals, LLC), and the polyethyleneimine 2 was mixed with water, thereby obtaining a composition A'. The pH of the composition A' was 9.5.

With regard to the polyethyleneimine 2, the weight-average molecular weight, the molecular weight distribution, the cationic functional group (primary nitrogen atom, secondary nitrogen atom, tertiary nitrogen atom, and quaternary nitrogen atom) equivalent weight, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were measured, respectively, similar to the highly branched polyethyleneimine 1.

As a result, the weight-average molecular weight was 130,774; the molecular weight distribution was 16.55; the cationic functional group equivalent weight was 43; the amount of primary nitrogen atom was 32% by mole; the amount of secondary nitrogen atom was 38% by mole; the amount of tertiary nitrogen atom was 30% by mole; the amount of quaternary nitrogen atom was 0% by mole; and the branching degree was 44%.

<Preparation of Composition A">

Next, a composition A" was obtained in the same manner as in the composition A' except that water was added and mixed such that the concentration of the polyethyleneimine 2 in the composition became 0.5% by mass. The pH of the composition A" was 9.5.

The content of sodium and the content of potassium in each of the obtained compositions A, A', and A" were each measured using an inductively coupled plasma mass spectrometer (ICP-MS) and, as a result, both the contents were equal to or less than the detection limit (<1 ppb by mass).

<Preparation of Polyvalent Carboxylic Acid Liquid>

First, pyromellitic acid, 4,4'-oxydiphthalic acid, and 3,3',4,4'-benzophenone tetracarboxylic acid were prepared as a polyvalent carboxylic acid compound (B), and respectively mixed with water, thereby producing polyvalent carboxylic acid liquids B-1 and B-2, polyvalent carboxylic acid liquids B'-1 and B'-2, and a polyvalent carboxylic acid liquid B". More specifically, the acids were respectively mixed with water such that a pyromellitic acid concentration, a 4,4'-oxydiphthalic acid concentration, and a 3,3',4,4'-benzophenone tetracarboxylic acid concentration became 0.388 mmol/L, thereby preparing polyvalent carboxylic acid liquids B-1, B'-1, and B".

The acids were respectively mixed with water such that a pyromellitic acid concentration, a 4,4'-oxydiphthalic acid concentration, and a 3,3',4,4'-benzophenone tetracarboxylic acid concentration became 0.4 mmol/L, thereby preparing polyvalent carboxylic acid liquids B-2 and B'-2.

The pH of each of the polyvalent carboxylic acid liquids B-1 and B-2, the polyvalent carboxylic acid liquids B'-1 and B'-2, and the polyvalent carboxylic acid liquid B" was 3.4.

<Production of Silicon Wafer Provided with Insulating Layer (Low-k Film)>

(Preparation of Precursor Solution)

77.4 g of bis(triethoxysilyl)ethane and 70.9 g of ethanol were mixed and stirred at room temperature. Then, 80 mL of 1 mol/L nitric acid was added thereto, and the resultant was stirred at 50° C. for 1 hour. Subsequently, a solution obtained by dissolving 20.9 g of polyoxyethylene (20) stearyl ether in 280 g of ethanol was dropwise added thereto and mixed. After mixing, the mixture was stirred at 30° C. for 4 hours. The obtained solution was concentrated to 105 g at 25° C., under a reduced pressure of 30 hPa. After concentration, a solution obtained by mixing 1-propyl alcohol and 2-butyl alcohol at a volume ratio of 2:1 was added thereto, thereby obtaining a precursor solution in an amount of 1,800 g.

(Preparation of Composition for Forming Porous Silica)

3.4 g of dimethyldiethoxysilane and 1.8 g of hexamethyldisiloxane were added to 472 g of the precursor solution, and the mixture was stirred at 25° C. for 1 hour, thereby obtaining a composition for forming porous silica. The amount of dimethyldiethoxysilane added and the amount of hexamethyldisiloxane added were 10% by mole and 5% by mole, respectively, with respect to bis(triethoxysilyl)ethane.

(Formation of Insulating Layer)

1.0 mL of the composition for forming porous silica was dropped onto a surface of a silicon wafer, and the silicon wafer was rotated at 2,000 rpm for 60 seconds, thereby coating the surface of the silicon wafer with the composition. Then, the silicon wafer was subjected to a heating treatment, under a nitrogen atmosphere, at 150° C. for 1 minute and then at 350° C. for 10 minutes. Thereafter, the silicon wafer was heat-treated up to 350° C. in a chamber equipped with a 172 nm excimer lamp, and was irradiated with ultraviolet rays for 10 minutes at a pressure of 1 Pa and an output of 14 mW/cm$^2$, thereby obtaining an insulating layer (porous silica film).

In this way, a silicon wafer provided with the insulating layer (hereinafter also referred to as "a Low-k film" or "Low-k") was obtained.

The pore radius of the obtained insulating layer was 1.6 nm.

The elastic modulus of the obtained insulating layer was 8.8 GPa.

The pore radius was calculated from a desorption isotherm of toluene. Here, the measurement of the desorption isotherm of toluene was carried out according to the following method.

<Measurement of Desorption Isotherm of Toluene>

The measurement of the desorption isotherm of toluene was carried out according to measurement of adsorption of toluene on the surface of a Low-k film.

The measurement of adsorption of toluene was carried out using an optical porosimeter (PS-1200) manufactured by SEMILAB CO., LTD.

The measurement method was carried out according to the method described in Journal of Vacuum Science and Technology B (2000) 18, 1385-1391, by M. R. Baklanov, K. P. Mogilnikov, V. G Polovinkin, and F. N. Dultsey.

Specifically, at a temperature range of from 23° C. to 26° C., the air in a sample chamber in which the sample (Si/Low-k) was placed was exhausted to 5 mTorr, and then toluene gas was slowly and sufficiently introduced into the sample chamber. At respective pressure values, the refractive index of the Low-k film was measured in situ, using an ellipsometer device. This procedure was repeated until the pressure inside the sample chamber reached the saturated vapor pressure of toluene. Similarly, while the atmosphere inside the sample chamber was gradually exhausted, the measurement of refractive index was carried out at respective pressure values. Through the above procedures, changes in the refractive index due to adsorption of toluene on the Low-k film and desorption of toluene from the Low-k film were determined. Furthermore, using the Lorentz-Lorenz formula, the toluene gas adsorption desorption isotherm was determined from the relative pressure characteristics of the refractive index.

The toluene gas adsorption desorption isotherm is an isotherm illustrating the relationship between the toluene relative pressure ($P/P_0$, wherein P represents a partial pressure of toluene at room temperature, and $P_o$ represents a saturated vapor pressure of toluene at room temperature.) and the volume fraction of toluene adsorption amount (the percentage of the volume of adsorbed toluene at room temperature relative to the volume of the whole Low-k film; unit "%"). The volume fraction of toluene adsorption amount was determined based on the refractive index of the Low-k film, using the Lorentz-Lorenz formula.

The volume fraction (%) of toluene adsorption amount at a toluene relative pressure ($P/P_0$) of 1.0 was determined based on the toluene gas adsorption desorption isotherm, and, based on the obtained value, the pore radius was calculated.

The calculation of the pore radius was carried out using the Kelvin Formula, according to the procedure described in Journal of Vacuum Science and Technology B (2000) 18, 1385-1391, by M. R. Baklanov, K. P. Mogilnikov, V. G Polovinkin, and F. N. Dultsey.

The elastic modulus was measured according to an ordinary method, using a nanoindentater (Triboscope, by Hysitron, Inc.) at a penetration depth of 1/10 or less of the film thickness.

Examples 1 to 5 and Comparative Examples 1 and 2

<Production of Laminated Body 1 of Silicon Wafer/Low-k Film/Adhesion layer/Electrode (Cu Film)>

(Application of Composition)

The composition A or A' was applied to the Low-k film surface of the silicon wafer provided with the Low-k film obtained above. Specifically, the silicon wafer provided with the Low-k film obtained above was placed on a spin coater, and 1.0 mL of the composition A or A' was dropped on the surface of the Low-k film at a constant speed for 10 seconds, and maintained for 13 seconds. The silicon wafer was then rotated at 2,000 rpm for 1 second, then at 600 rpm for 30 seconds, and then at 2,000 rpm for 10 seconds, thereby carrying out drying.

A composition was not applied in Comparative Example 1.

Next, the dried silicon wafer was placed on a hot plate such that the silicon wafer side was in contact with the hot plate, and subjected to soft bake (heat treatment) at a soft bake temperature of 100° C. for 60 seconds, under an air atmosphere, thereby forming a polymer layer.

The soft bake temperature as used herein refers to a temperature of the surface of the silicon wafer.

(Application of Polyvalent Carboxylic Acid Liquid)

A polyvalent carboxylic acid liquid B-1, B'-1, or B" was applied to the surface of the silicon wafer on which the polymer layer was formed. Specifically, while the silicon wafer was rotated at 600 rpm, using a spin coater, a polyvalent carboxylic acid liquid B-1, B'-1, or B" was added dropwise onto the polymer layer at a dropwise addition speed of 0.1 mL/sec for 30 seconds.

Subsequently, ultrapure water (at a liquid temperature of 22° C.) was added dropwise at a dropwise addition speed of 0.1 mL/sec for 30 seconds, thereby performing a cleaning treatment. Subsequently, the sample was rotated at 4,000 rpm for 60 seconds, thereby performing drying.

A polyvalent carboxylic acid liquid was not applied in Comparative Examples 1 and 2.

(Heat Treatment)

Next, the silicon wafer subjected to the cleaning treatment was subjected to a heat treatment under the following condition (hard bake treatment). First, the silicon wafer was placed in an oven (SPX-1120, manufactured by APEX Co., Ltd.), and the side of this sample at which the polymer layer had been formed was subjected to a heat treatment at a temperature of 350° C. for 2 minutes, in a nitrogen gas ($N_2$) atmosphere under the condition of a pressure of 10,000 Pa, thereby forming an adhesion layer. The temperature described above is the surface temperature of the silicon wafer at a side at which the polymer layer has been formed.

In this way, a laminated body was obtained, which had a structure in which the silicon wafer provided with the Low-k film and the adhesion layer were layered.

(Formation of Electrode)

On the adhesion layer of the laminated body obtained by the heat treatment, a copper film (thickness: 100 nm) was formed by sputtering, thereby forming an electrode. Thereby, a laminated body 1 was obtained, in which the silicon wafer, the Low-k film, the adhesion layer, and the electrode (Cu film) were layered in this order.

<Grid Test>

The following grid test was performed for adhesion evaluation in the laminated body 1 in which the electrode was formed. Specifically, 5×5 square cells each having a side of 2 mm were formed in the Cu film side surface of the laminated body 1 by a cutter, and a Scotch tape (3M No. 56) was then stuck thereon, followed by tearing off the Scotch tape at once. The number of the cells remaining without being torn off was measured.

The results are shown in Table 1.

<Production of Laminated Body 2 of Silicon Wafer and Adhesion layer>

A silicon wafer (low resistance silicon substrate, resistivity: 0.02Ω·cm or less) was prepared, and the silicon wafer was subjected to the same treatment as the above except that an insulating layer and an electrode were not formed, and thus an adhesion layer was formed on the silicon wafer, thereby obtaining a laminated body 2 (silicon wafer/adhesion layer) having a structure in which the silicon wafer and the adhesion layer were layered.

<Evaluation of Thickness of Adhesion layer in Laminated Body 2>

The thickness (nm) of the adhesion layer of the obtained laminated body 2 (silicon wafer/adhesion layer) was measured according to an ordinary method, using an ellipsometer of an optical porosimeter (PS-1200) manufactured by SEMILAB CO., LTD.

The results are shown in Table 1.

<Production of Laminated Body 3 of Silicon Wafer and Adhesion layer>

A silicon wafer (low resistance silicon substrate, resistivity: 0.02 SI. cm or less) was prepared, and the silicon wafer was subjected to the same treatment as the above except that an insulating layer and an electrode were not formed, and the application of a composition A or A' and soft bake was repeated three times, and thus an adhesion layer was formed on the silicon wafer, thereby obtaining a laminated body 3 (silicon wafer/adhesion layer) having a structure in which the silicon wafer and the adhesion layer were layered.

<Cross-Linked Structure>

The cross-linked structure of the reaction product contained in the adhesion layer of the obtained laminated body 3 (silicon wafer/adhesion layer) was measured by FT-IR (Fourier transform IR spectroscopy). The used analysis device is as follows.

—FT-IR Analysis Device—

Infrared absorption analyzer (DIGILAB Excalibur (manufactured by DIGILAB, Inc.))

—Measurement Conditions—

IR light source: air-cooled ceramic
beamsplitter: wide-range KBr
detector: Peltier-cooled DTGS
measurement wavenumber range: 7500 $cm^{-1}$ to 400 $cm^{-1}$
resolution: 4 $cm^{-1}$
cumulative number: 256
background: bare Si wafer is used
measurement atmosphere: $N_2$ (10 L/min)
angle of incidence of IR (infrared radiation): 72 degrees (=Brewster's angle of Si)

—Determination Conditions—

An imide bond was determined from the presence of vibrating peaks at 1770 $cm^{-1}$ and 1720 $cm^{-1}$. An amide bond was determined from the presence of vibrating peaks at 1650 $cm^{-1}$ and 1520 $cm^{-1}$.

The results are shown in Table 2. The cross-linked structure of the laminated body 3 in each of Examples 1 to 5 and Comparative Example 2 was measured.

<Evaluation of Thickness of Adhesion layer in Laminated Body 3>

The thickness (nm) of the adhesion layer of the obtained laminated body 3 (silicon wafer/adhesion layer) was measured according to an ordinary method, using an ellipsometer of an optical porosimeter (PS-1200) manufactured by SEMILAB CO., LTD.

The results are shown in Table 2. The thickness of the adhesion layer in the laminated body 3 in each of Examples 1 to 4 and Comparative Example 2 was evaluated.

<Measurement of Relative Dielectric Constant>

The relative dielectric constant of the adhesion layer in the obtained laminated body 3 (silicon wafer/adhesion layer) was measured.

The relative dielectric constant was measured by an ordinary method at a frequency of 100 kHz under an atmosphere of 25° C. and a relative humidity of 30%, using a mercury probe apparatus (SSM5130).

The results are shown in Table 2. The relative dielectric constant of the laminated body 3 in each of Examples 1 to 4 and Comparative Example 2 was measured.

<Leakage Current Density>

Next, a leakage current density was measured as follows for electrical property evaluation. Specifically, a mercury probe was applied to the surface of the adhesion layer of the obtained laminated body 3 (silicon wafer/adhesion layer), and the measured value at field intensity of 1 MV/cm was used as the leakage current density.

The results are shown in Table 2. The leakage current density of the laminated body 3 in each of Examples 1 to 4 and Comparative Example 2 was measured.

The results of the grid test, the thickness of the adhesion layer, the leakage current density, and the relative dielectric constant in each of Examples and Comparative Examples are shown in Tables 1 and 2.

TABLE 1

| | Composition containing polymer (A) | | Polyvalent carboxylic acid liquid (B) | | Grid test | Film thickness of adhesion layer in laminated body 2 (on silicon wafer) (nm) |
|---|---|---|---|---|---|---|
| Example 1 | Highly branched polyethyleneimine 1 + water (solvent) Concentration of highly branched polyethyleneimine 1: 0.25% by mass, pH 9.5 | Composition A | Pyromellitic acid + water (solvent) Concentration of pyromellitic acid: 0.388 mmol/L, pH 3.4 | B-1 | No peeling | 5.1 |
| Example 2 | Highly branched polyethyleneimine 1 + water (solvent) Concentration of highly branched polyethyleneimine 1: 0.25% by mass, pH 9.5 | Composition A | 4.4'-oxydiphthalic acid + water (solvent) Concentration of 4.4'-oxydiphthalic acid: 0.388 mmol/L, pH 3.4 | B'-1 | No peeling | 7.6 |
| Example 3 | Polyethyleneimine 2 + water (solvent) Concentration of polyethyleneimine 2: 0.25% by mass, pH 9.5 | Composition A' | Pyromellitic acid + water (solvent) Concentration of pyromellitic acid: 0.388 mmol/L, pH 3.4 | B-1 | No peeling | 4.4 |

TABLE 1-continued

|  | Composition containing polymer (A) | | Polyvalent carboxylic acid liquid (B) | | Grid test | Film thickness of adhesion layer in laminated body 2 (on silicon wafer) (nm) |
|---|---|---|---|---|---|---|
| Example 4 | Polyethyleneimine 2 + water (solvent) Concentration of polyethyleneimine 2: 0.25% by mass, pH 9.5 | Composition A' | 4.4'-oxydiphthalic acid + water (solvent) Concentration of 4.4'-oxydiphthalic acid: 0.388 mmol/L, pH 3.4 | B'-1 | No peeling | 6.2 |
| Example 5 | Highly branched polyethyleneimine 1 + water (solvent) Concentration of highly branched polyethyleneimine 1: 0.25% by mass, pH 9.5 | Composition A | 3,3',4,4'-benzophenone tetracarboxylic acid + water (solvent) Concentration of 3,3',4,4'-benzophenone tetracarboxylic acid: 0.388 mmol/L, pH 3.4 | B" | No peeling | 6.8 |
| Comparative Example 1 | None | None | None | None | All were peeled off (peeled surface: between Low-k film and Cu film) | |
| Comparative Example 2 | Highly branched polyethyleneimine 1 + water (solvent) Concentration of highly branched polyethyleneimine 1: 0.25% by mass, pH 9.5 | Composition A | None | None | No peeling | 7 |

TABLE 2

|  | Polymer (A) | | Polyvalent carboxylic acid liquid (B) | | Film thickness of adhesion layer in laminated body 3 (on silicon wafer) (nm) | Leakage current density (A/cm2) | Relative dielectric constant (100 kHz) | Cross-linked structure |
|---|---|---|---|---|---|---|---|---|
| Example 1 | Highly branched polyethyleneimine 1 + water (solvent) Concentration of highly branched polyethyleneimine 1: 0.25% by mass, pH 9.5 | Composition A | Pyromellitic acid + water (solvent) Concentration of pyromellitic acid: 0.388 mmol/L, pH 3.4 | B-1 | 18 | $4.8 \times 10^{-5}$ | $7.8 \pm 1.3$ | Imide bond |
| Example 2 | Highly branched polyethyleneimine 1 + water (solvent) Concentration of highly branched polyethyleneimine 1: 0.25% by mass, pH 9.5 | Composition A | 4.4'-oxydiphthalic acid + water (solvent) Concentration of 4.4'-oxydiphthalic acid: 0.388 mmol/L, pH 3.4 | B'-1 | 11 | $4.8 \times 10^{-5}$ | $5.8 \pm 0.6$ | Imide bond |
| Example 3 | Polyethyleneimine 2 + water (solvent) Concentration of polyethyleneimine 2: 0.25% by mass, pH 9.5 | Composition A' | Pyromellitic acid + water (solvent) Concentration of pyromellitic acid: 0.388 mmol/L, pH 3.4 | B-1 | 14 | $2.4 \times 10^{-5}$ | $6.5 \pm 1.2$ | Imide bond |
| Example 4 | Polyethyleneimine 2 + water (solvent) Concentration of polyethyleneimine 2: 0.25% by mass, pH 9.5 | Composition A' | 4.4'-oxydiphthalic acid + water (solvent) Concentration of 4.4'-oxydiphthalic acid: 0.388 mmol/L, pH 3.4 | B'-1 | 14 | $1.9 \times 10^{-5}$ | $6.1 \pm 1.6$ | Imide bond |
| Example 5 | Highly branched polyethyleneimine 1 + water (solvent) Concentration of highly branched polyethyleneimine 1: 0.25% by mass, pH 9.5 | Composition A | 3,3',4,4'-benzophenone tetracarboxylic acid + water (solvent) Concentration of 3,3',4,4'-benzophenone tetracarboxylic acid: 0.388 mmol/L, pH 3.4 | B" | | | | Imide bond |

TABLE 2-continued

| | Polymer (A) | | Polyvalent carboxylic acid liquid (B) | Film thickness of adhesion layer in laminated body 3 (on silicon wafer) (nm) | Leakage current density (A/cm2) | Relative dielectric constant (100 kHz) | Cross-linked structure |
|---|---|---|---|---|---|---|---|
| Comparative Example 2 | Highly branched polyethyleneimine 1 + water (solvent) Concentration of highly branched polyethyleneimine 1: 0.25% by mass, pH 9.5 | Composition A | None | None | 10 | Short | 4.6 ± 0.4 | No amide bond and no imide bond |

Examples 1 and 2 had excellent adhesion without having peeling between the Low-k film and the electrode, and could suppress a leakage current. Examples 3 and 4 could suppress a leakage current. In Example 5, a leakage current could not be evaluated, but Example 5 had excellent adhesion without having peeling between the Low-k film and the electrode.

On the other hand, Comparative Example 1 had insufficient adhesion between the Low-k film and the electrode, and Comparative Example 2 could not suppress a leakage current, which caused a short circuit.

Examples 6 and 7, Comparative Example 3

<Production of Laminated Body 4 of Silicon Wafer/Low-k Film/Adhesion layer/Electrode (Cu Film)>
(Application of Composition)
A polymer layer was formed on the surface of a Low-k film of a silicon wafer provided with the Low-k film in the same manner as in the formation of the polymer layer in the laminated body 1 except that a composition A'' was used in place of the composition A or A', and a soft bake temperature was changed to 125° C. from 100° C.
(Application of Polyvalent Carboxylic Acid Liquid)
A polyvalent carboxylic acid liquid was applied to the surface of a silicon wafer on which a polymer layer was formed, cleaned, and dried in the same manner as in the production of the laminated body 1 except that a polyvalent carboxylic acid liquid B-2 or B'-2 was used in place of the polyvalent carboxylic acid liquid B-1, B'-1, or B''.
A polyvalent carboxylic acid liquid was not applied in Comparative Example 3.
(Heat Treatment)
Next, the silicon wafer subjected to the cleaning treatment was subjected to a heat treatment (hard bake treatment) in the same manner as in the heat treatment in the production of the laminated body 1 except that the pressure of 10,000 Pa, the temperature of 350° C., and the heat treatment time of 2 minutes as the heat treatment conditions were respectively changed to a pressure of 30,000 Pa, a temperature of 380° C., and a heat treatment time of 10 minutes.

(Formation of Electrode)
An electrode was formed on the adhesion layer of the laminated body obtained by the heat treatment in the same manner as in the production of the laminated body 1, thereby obtaining a laminated body 4 in which a silicon wafer, a Low-k film, an adhesion layer, and an electrode (Cu film) were layered in this order.
<Grid Test>
The laminated body 4 was subjected to a grid test in the same manner as in the laminated body 1. The results are shown in Table 3.
<Grid Test After Heat Treatment>
The laminated body 4 (silicon wafer/Low-k film/adhesion layer/electrode (Cu film)) obtained above was heat-treated under the following condition. First, the laminated body 4 was placed in an oven (SPX-1120, manufactured by APEX Co., Ltd.), and the side of this sample at which the polymer layer had been formed was subjected to a heat treatment at a temperature of 300° C. for 10 minutes, in a nitrogen gas ($N_2$) atmosphere under the condition of a pressure of 30,000 Pa. The temperature described above is the surface temperature of the silicon wafer at a side at which the polymer layer has been formed.
The laminated body 4 after the heat treatment was subjected to a grid test in the same manner as in the laminated body 1.
The results are shown in Table 3.
<Production of Laminated Body 5 of Silicon Wafer and Adhesion layer>
A silicon wafer (low resistance silicon substrate, resistivity: 0.02Ω·cm or less) was prepared, and the silicon wafer was subjected to the same treatment as the above except that an insulating layer and an electrode were not formed, and thus an adhesion layer was formed on the silicon wafer, thereby obtaining a laminated body 5 (silicon wafer/adhesion layer) having a structure in which the silicon wafer and the adhesion layer were layered.
<Evaluation of Thickness of Adhesion layer in Laminated Body 5>
The thickness (nm) of the adhesion layer of the obtained laminated body 5 (silicon wafer/adhesion layer) was measured in the same manner as in the laminated body 2.
The results are shown in Table 3.

TABLE 3

| | Polymer (A) | | Polyvalent carboxylic acid liquid (B) | Grid test | Grid Test (after heating at 300° C.) | Film thickness of adhesion layer in laminated body 5 (on silicon wafer) (nm) |
|---|---|---|---|---|---|---|
| Example 6 | Polyethyleneimine 2 + water (solvent) Concentration of polyethyleneimine 2: 0.5% by mass, pH 9.5 | Composition A'' | Pyromellitic acid + water (solvent) Concentration of pyromellitic acid: 0.4 mmol/L, pH 3.4 | B-2 | No peeling | 11 cells were peeled off | 4.9 |

TABLE 3-continued

|  | Polymer (A) |  | Polyvalent carboxylic acid liquid (B) |  | Grid test | Grid Test (after heating at 300° C.) | Film thickness of adhesion layer in laminated body 5 (on silicon wafer) (nm) |
|---|---|---|---|---|---|---|---|
| Example 7 | Polyethyleneimine 2 + water (solvent) Concentration of polyethyleneimine 2: 0.5% by mass, pH 9.5 | Composition A" | 4.4'-oxydiphthalic acid + water (solvent) Concentration of 4.4'-oxydiphthalic acid: 0.4 mmol/L, pH 3.4 | B'-2 | No peeling | No peeling | 7.5 |
| Comparative Example 3 | Polyethyleneimine 2 + water (solvent) Concentration of polyethyleneimine 2: 0.5% by mass, pH 9.5 | Composition A" | None | None | All were peeled off (peeled surface: between Low-k film and Cu film). | 22 cells were peeled off | 1.3 |

Examples 6 and 7 (particularly, Example 7) had excellent adhesion between the Low-k film and the electrode also after the heat treatment, and Comparative Example 3 had insufficient adhesion between the Low-k film and the electrode before and after the heat treatment.

The content of the disclosure by Japanese Patent Application No. 2014-255013 filed on Dec. 17, 2014 is herein entirely incorporated by reference.

All publications, patent applications, and technical standards mentioned in this specification are herein incorporated by reference to the same extent as if each individual publication, patent application, and technical standard were specifically and individually indicated to be incorporated by reference.

The invention claimed is:

1. A substrate intermediary body, comprising:
a substrate having a hole provided in a thickness direction, and a conductor being disposed in the hole;
an adhesion layer formed on a wall surface of the hole, and
an insulating layer provided between the substrate and the adhesion layer,
wherein the adhesion layer contains a chemical reaction product of a polymer (A) having a cationic functional group and having a weight-average molecular weight of from 2,000 to 1,000,000, and a polyvalent carboxylic acid compound (B) having two or more carboxyl groups per molecule or a derivative thereof, and wherein the polyvalent carboxylic acid compound (B) has an aromatic ring, wherein the chemical reaction product has at least one of an amide bond or an imide bond.

2. The substrate intermediary body according to claim 1, wherein
the polymer (A) has a cationic functional group equivalent weight of from 27 to 430.

3. The substrate intermediary body according to claim 2, wherein
the polymer (A) is polyethyleneimine or a polyethyleneimine derivative.

4. The substrate intermediary body according to claim 2, wherein
the polyvalent carboxylic acid compound (B) has an aromatic ring.

5. The substrate intermediary body according to claim 2, wherein
the reaction product has at least one of an amide bond or an imide bond.

6. A through-hole via electrode substrate, comprising:
the substrate intermediary body according to claim 2; and
an electrode as the conductor disposed in the hole.

7. The substrate intermediary body according to claim 1, wherein
the polymer (A) is polyethyleneimine or a polyethyleneimine derivative.

8. A through-hole via electrode substrate, comprising:
the substrate intermediary body according to claim 1; and
an electrode as the conductor disposed in the hole.

9. The through-hole via electrode substrate according to claim 8, further
comprising a barrier layer provided between the adhesion layer and the electrode.

10. A substrate intermediary body, comprising:
a substrate having a hole provided in a thickness direction, and a conductor being disposed in the hole; and
an adhesion layer formed on a wall surface of the hole,
wherein the adhesion layer contains a chemical reaction product of a polymer (A) having a cationic functional group and having a weight-average molecular weight of from 2,000 to 1,000,000, and a polyvalent carboxylic acid compound (B) having two or more carboxyl groups per molecule or a derivative thereof and wherein the polyvalent carboxylic acid compound (B) has an aromatic ring, wherein the chemical reaction product has at least one of an amide bond or an imide bond.

11. A through-hole via electrode formation method, comprising:
forming a film containing a polymer (A) having a cationic functional group and having a weight-average molecular weight of from 2,000 to 1,000,000 on a wall surface of a hole of a substrate, the hole being provided in a thickness direction of the substrate;
applying a polyvalent carboxylic acid compound (B) having two or more carboxyl groups per molecule, or a derivative thereof, onto the film containing the polymer (A);
heating the film containing the polymer (A) and the polyvalent carboxylic acid compound (B) or the derivative thereof at from 200° C. to 425° C., thereby forming an adhesion layer; and
forming an electrode in the hole in which the adhesion layer is formed,
wherein the adhesion layer contains a reaction product of the polymer (A) and the polyvalent carboxylic acid compound (B) or the derivative thereof.

* * * * *